(12) United States Patent
Yu et al.

(10) Patent No.: US 12,438,082 B2
(45) Date of Patent: Oct. 7, 2025

(54) PACKAGE STRUCTURES AND METHOD OF FORMING THE SAME

(71) Applicant: Taiwan Semiconductor Manufacturing Co., Ltd., Hsinchu (TW)

(72) Inventors: Chen-Hua Yu, Hsinchu (TW); An-Jhih Su, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/411,930

(22) Filed: Jan. 12, 2024

(65) Prior Publication Data

US 2024/0153872 A1 May 9, 2024

Related U.S. Application Data

(60) Division of application No. 17/322,004, filed on May 17, 2021, now Pat. No. 11,908,795, which is a
(Continued)

(51) Int. Cl.
*H01L 23/528* (2006.01)
*H01L 21/56* (2006.01)
(Continued)

(52) U.S. Cl.
CPC .......... *H01L 23/528* (2013.01); *H01L 21/561* (2013.01); *H01L 21/568* (2013.01);
(Continued)

(58) Field of Classification Search
CPC ................ H01L 21/561; H01L 21/568; H01L 21/76877; H01L 24/19; H01L 24/20; H01L 24/96; H01L 24/97; H01L 2224/04105; H01L 2224/12105; H01L 2224/19; H01L 2224/2919; H01L 2224/32145; H01L 2224/73267; H01L 2224/83005; H01L 2224/83101; H01L 2224/92244; H01L 2224/97
See application file for complete search history.

(56) References Cited

U.S. PATENT DOCUMENTS 6,765,299 B2 7/2004 Takahashi et al.
6,958,537 B2 10/2005 Eng et al.
(Continued)

FOREIGN PATENT DOCUMENTS

CN 104377192 A 2/2015
KR 20150020058 A 2/2015

*Primary Examiner* — Peniel M Gumedzoe
(74) *Attorney, Agent, or Firm* — Slater Matsil, LLP

(57) ABSTRACT

An embodiment is a method including forming a first package. The forming the first package includes forming a through via adjacent a first die, at least laterally encapsulating the first die and the through via with an encapsulant, and forming a first redistribution structure over the first die, the through via, and the encapsulant. The forming the first redistribution structure including forming a first via on the through via, and forming a first metallization pattern on the first via, at least one sidewall of the first metallization pattern directly overlying the through via.

20 Claims, 52 Drawing Sheets

Related U.S. Application Data continuation of application No. 16/222,122, filed on Dec. 17, 2018, now Pat. No. 11,011,464, which is a continuation of application No. 15/728,211, filed on Oct. 9, 2017, now Pat. No. 10,157,835, which is a division of application No. 14/935,160, filed on Nov. 6, 2015, now Pat. No. 9,786,599.

(60) Provisional application No. 62/208,436, filed on Aug. 21, 2015.

(51) Int. Cl.

| | | |
|---|---|---|
| *H01L 21/768* | (2006.01) | |
| *H01L 23/00* | (2006.01) | |
| *H01L 23/48* | (2006.01) | |
| *H01L 23/538* | (2006.01) | |
| *H01L 25/065* | (2023.01) | |
| *H01L 23/498* | (2006.01) | |

(52) U.S. Cl.
CPC ...... *H01L 21/76877* (2013.01); *H01L 23/481* (2013.01); *H01L 23/5389* (2013.01); *H01L 24/19* (2013.01); *H01L 24/20* (2013.01); *H01L 24/96* (2013.01); *H01L 24/97* (2013.01); *H01L 25/0657* (2013.01); *H01L 23/49816* (2013.01); *H01L 23/5386* (2013.01); *H01L 2224/04105* (2013.01); *H01L 2224/12105* (2013.01); *H01L 2224/19* (2013.01); *H01L 2224/2919* (2013.01); *H01L 2224/32145* (2013.01); *H01L 2224/73267* (2013.01); *H01L 2224/83005* (2013.01); *H01L 2224/83101* (2013.01); *H01L 2224/92244* (2013.01); *H01L 2224/97* (2013.01); *H01L 2924/18162* (2013.01)

(56) References Cited

U.S. PATENT DOCUMENTS

| | | | |
|---|---|---|---|
| 8,446,017 B2* | 5/2013 | Paek | H01L 24/94 |
| | | | 257/777 |
| 9,324,698 B2 | 4/2016 | Yu et al. | |
| 2001/0038151 A1 | 11/2001 | Takahashi et al. | |
| 2004/0070064 A1* | 4/2004 | Yamane | H01L 24/24 |
| | | | 257/692 |
| 2005/0258547 A1 | 11/2005 | Terui | |
| 2009/0309212 A1 | 12/2009 | Shim et al. | |
| 2011/0186977 A1 | 8/2011 | Chi et al. | |
| 2012/0038034 A1 | 2/2012 | Shin et al. | |
| 2012/0112355 A1 | 5/2012 | Pagaila et al. | |
| 2013/0049218 A1 | 2/2013 | Gong et al. | |
| 2014/0110856 A1 | 4/2014 | Lin | |
| 2014/0131858 A1 | 5/2014 | Pan et al. | |
| 2014/0252647 A1 | 9/2014 | Huang et al. | |
| 2015/0048500 A1 | 2/2015 | Yu et al. | |
| 2015/0069623 A1 | 3/2015 | Tsai et al. | |
| 2015/0108635 A1 | 4/2015 | Liang et al. | |
| 2016/0163564 A1 | 6/2016 | Yu et al. | |
| 2016/0276248 A1 | 9/2016 | Huang et al. | |

* cited by examiner

PACKAGE STRUCTURES AND METHOD OF FORMING THE SAME

PRIORITY CLAIM AND CROSS-REFERENCE

This application is a divisional of U.S. patent application Ser. No. 17/322,004, filed May 17, 2021, which is a continuation of U.S. patent application Ser. No. 16/222,122, filed on Dec. 17, 2018, (now U.S. Pat. No. 11,011,464, issued May 18, 2021, which is a continuation of U.S. patent application Ser. No. 15/728,211, filed on Oct. 9, 2017, (now U.S. Pat. No. 10,157,835, issued Dec. 18, 2018), which is a divisional of U.S. patent application Ser. No. 14/935,160, filed on Nov. 6, 2015, (now U.S. Pat. No. 9,786,599, issued Oct. 10, 2017), which claims the benefit of U.S. Provisional Application No. 62/208,436, filed on Aug. 21, 2015, which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
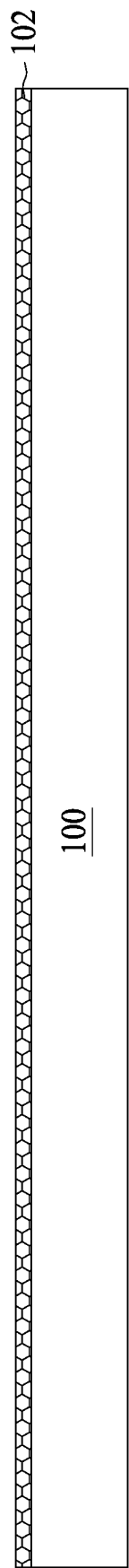
FIGS. 1 through 11, 12A-B, 13 through 22 are views of intermediate steps during a process for forming a package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure. The package structures may include a fan-out or fan-in package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 11, 12A-B, and 13 through 22 illustrate views of intermediate steps during a process for forming a package structure in accordance with some embodiments. FIGS. 1 through 11, 12A, and 13 through 22 illustrate cross sectional views with FIG. 12B being a top view. FIG. 1 illustrates a carrier substrate 100 and a release layer 102 formed on the carrier substrate 100.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heatconversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Figure 2:
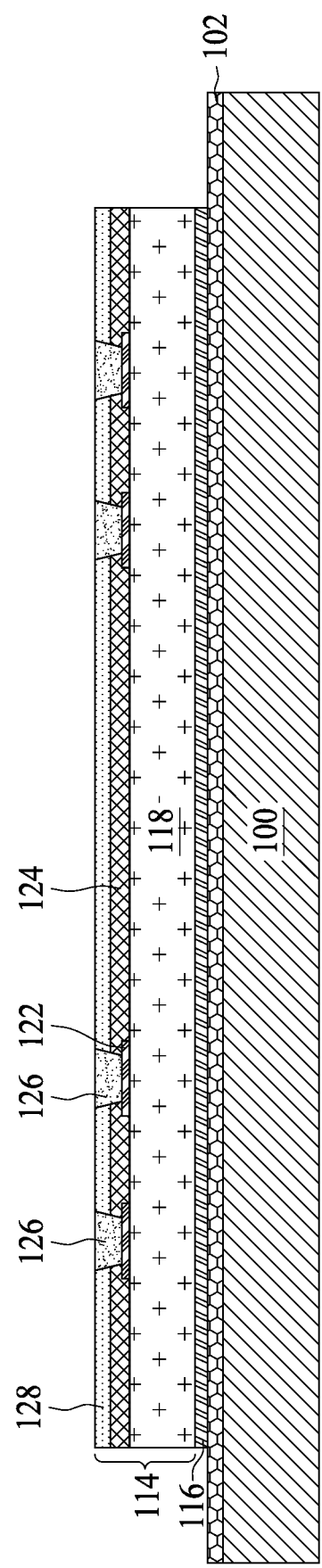

In FIG. 2, integrated circuit die 114 is adhered to the release layer 102 by an adhesive 116. As illustrated in FIG. 2, one integrated circuit die 114 is adhered in over the carrier substrate 100, and in other embodiments, more or less integrated circuit dies may be adhered over the carrier substrate 100.

Before being adhered to the release layer 102, the integrated circuit die 114 may be processed according to applicable manufacturing processes to form integrated circuits in the integrated circuit die 114. For example, the integrated circuit die 114 each comprise a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures (not shown) formed by, for example, metallization patterns in one or more dielectric layers on the semiconductor substrate 118 to form an integrated circuit.

The integrated circuit dies 114 further comprise pads 122, such as aluminum pads, coupled to the interconnect structures. The pads 122 allow for external connections to be made to the integrated circuit die 114. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars, are in the openings through passivation films 124 and are mechanically and electrically coupled to the respective pads 122. The die connectors 126 may be formed by plating, such as electroplating or electroless plating, or the like. The die connectors 126 may comprise a metal, like copper, titanium, tungsten, aluminum, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally co-terminus with the respective integrated circuit dies 114. The dielectric material 128 may be made of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

Adhesive 116 is on back side of the integrated circuit die 114 and adheres the integrated circuit die 114 to the carrier substrate 100, such as the release layer 102 in the illustration. The adhesive 116 may be any suitable adhesive, epoxy, die attach film (DAF), or the like. The adhesive 116 may be applied to a back side of the integrated circuit dies 114, such as to a back side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

The integrated circuit die 114 may be a logic die (e.g., central processing unit, microcontroller, etc.), a memory die (e.g., dynamic random access memory (DRAM) die, static random access memory (SRAM) die, etc.), a power management die (e.g., power management integrated circuit (PMIC) die), a radio frequency (RF) die, sensor dies, a micro-electro-mechanical-system (MEMS) die, a signal processing die (e.g., digital signal processing (DSP) die), a front-end die (e.g., analog front-end (AFE) dies), the like, or a combination thereof.

Figure 3:
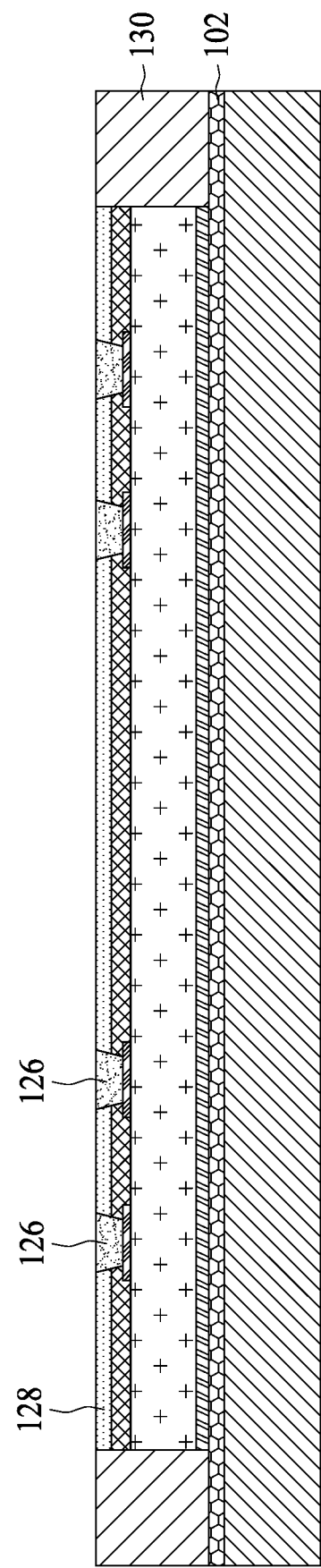

In FIG. 3, an encapsulant 130 is formed on the various components. The encapsulant 130 may be a molding compound, epoxy, or the like, and may be applied by compression molding, transfer molding, or the like. After curing, the encapsulant 130 can undergo a grinding process (e.g. a chemical mechanical polishing (CMP) process) to expose die connectors 126. Top surfaces of the die connectors 126 and encapsulant 130 are co-planar after the grinding process. In some embodiments, the grinding may be omitted, for example, if the die connectors 126 are already exposed.

Figure 4:
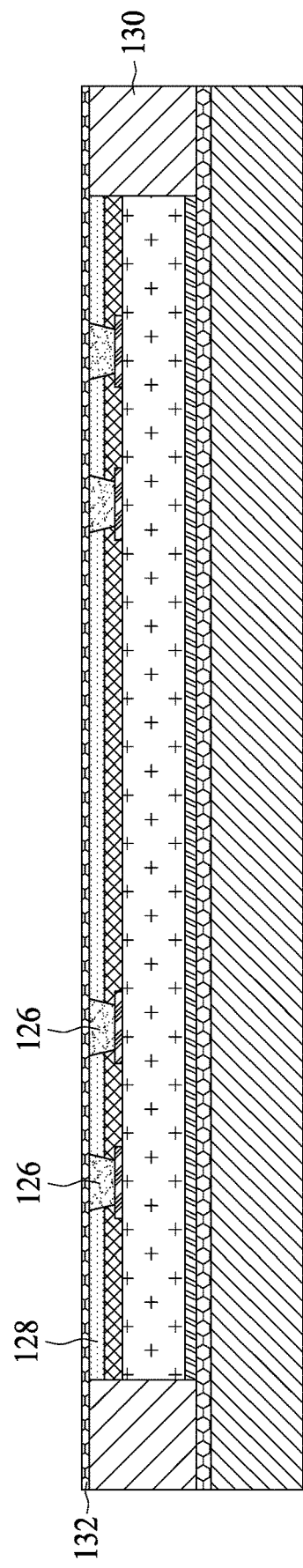

In FIG. 4, a seed layer 132 is formed on the various components. The seed layer 132 may be formed over the dielectric layer 128, the die connectors 126, and the encapsulant 130. In some embodiments, the seed layer 132 is a metal layer, which may be a single layer or a composite layer comprising a plurality of sub-layers formed of different materials. In some embodiments, the seed layer 132 comprises a titanium layer and a copper layer over the titanium layer. The seed layer 132 may be formed using, for example, physical vapor deposition (PVD) or the like.

Figure 5:
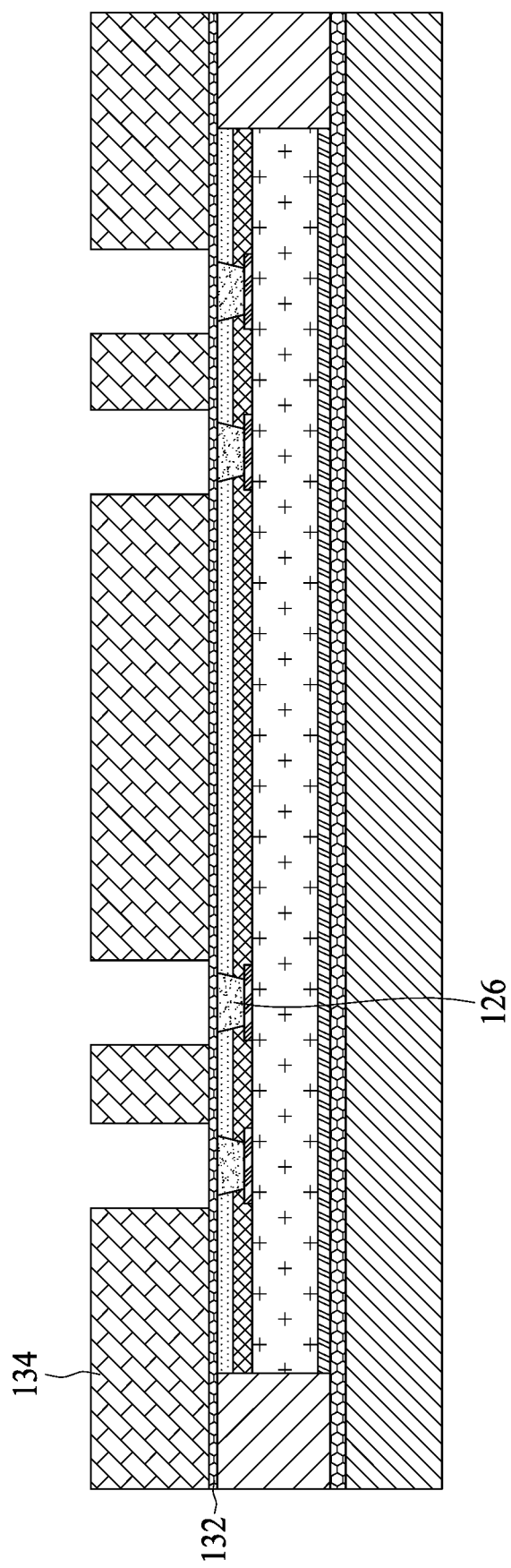

In FIG. 5, a photo resist 134 is then formed and patterned on the seed layer 132. The photo resist 134 may be formed by spin coating or the like and may be exposed to light for patterning. The pattern of the photo resist 134 corresponds to the die connectors 126. The patterning forms openings through the photo resist 134 to expose the seed layer 132 over the die connectors 126.

Figure 6:
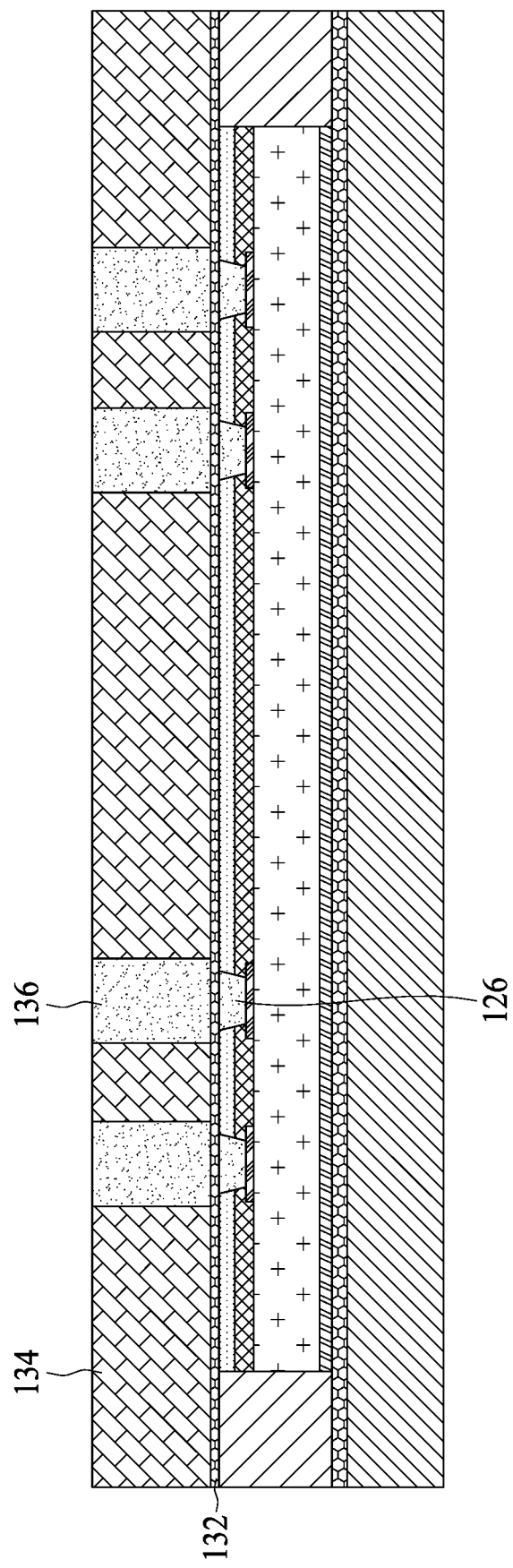

In FIG. 6, a conductive material is formed in the openings of the photo resist 134 and on the exposed portions of the seed layer 132 to form conductive features 136. The conductive material may be formed by plating, such as electroplating or electroless plating, or the like. The conductive material may comprise a metal, like copper, titanium, tungsten, aluminum, or the like.

Figure 7:
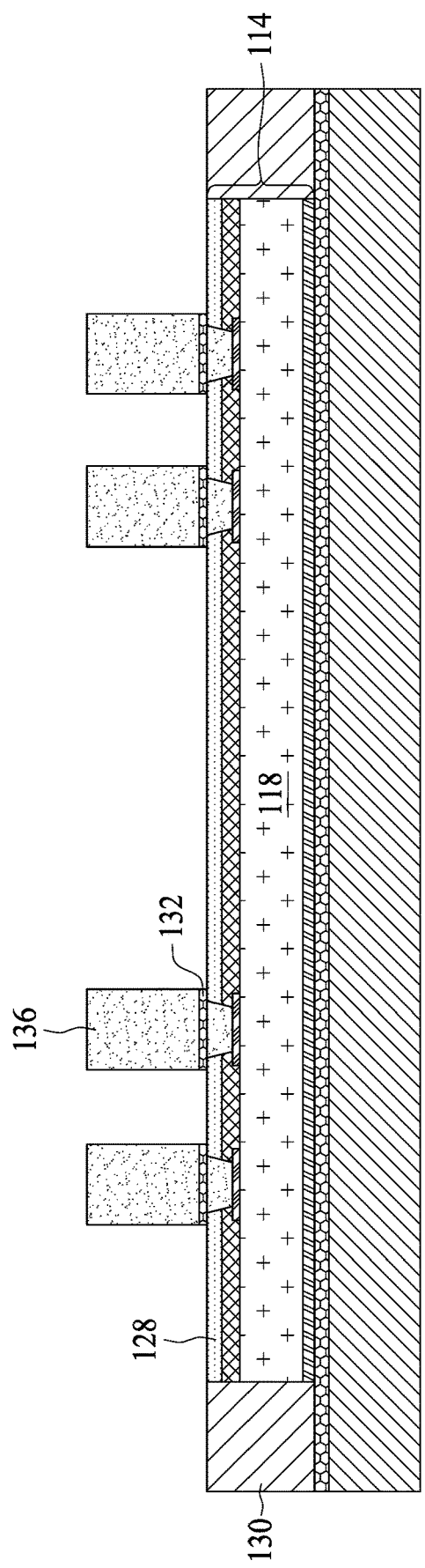

In FIG. 7, the photo resist 134 and portions of the seed layer 132 on which the conductive material is not formed are removed. The photo resist 134 may be removed by an acceptable ashing or stripping process, such as using an oxygen plasma or the like. Once the photo resist 134 is removed, exposed portions of the seed layer 132 are removed, such as by using an acceptable etching process, such as by wet or dry etching. The remaining portions of the seed layer 132 and conductive material form the conductive features 136. The conductive features 136 may be referred to as through vias 136 or through molding vias (TMVs) 136. Subsequent figures do not illustrate the seed layer 132. As illustrated in FIG. 7, four through vias 136 are formed over and coupled to the integrated circuit die 114, and in other embodiments, more or less through vias 136 may be formed over and coupled to the integrated circuit die 114.

Figure 8:
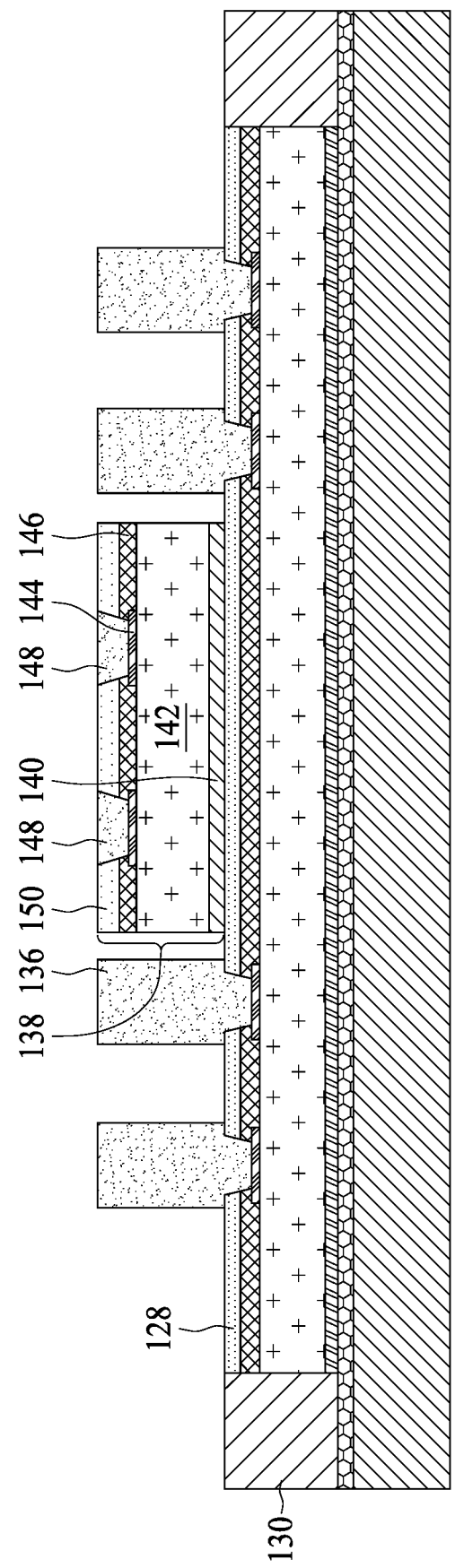

In FIG. 8, an integrated circuit die 138 is adhered over the integrated circuit die 114, e.g., to the dielectric layer 128 of the integrated circuit die 114. The integrated circuit die 138 may be adhered by an adhesive 140, which may be similar to the adhesive 116 described above and the description is not repeated herein. As illustrated in FIG. 8, one integrated circuit die 138 is adhered in over the integrated circuit die 114, and in other embodiments, more or less integrated circuit dies may be adhered over the integrated circuit die 114.

The integrated circuit die 138 may be similar to the integrated circuit die 114 described above and the description is not repeated herein, although the integrated circuit dies 114 and 138 need not be the same. The components 142, 144, 146, 148, and 150 of the integrated circuit die 138 may be similar to the components 118, 122, 124, 126, and 128 of the integrated circuit die 114 described above and the descriptions are not repeated herein although the components of the integrated circuit dies 114 and 138 need not be the same.

Figure 9:
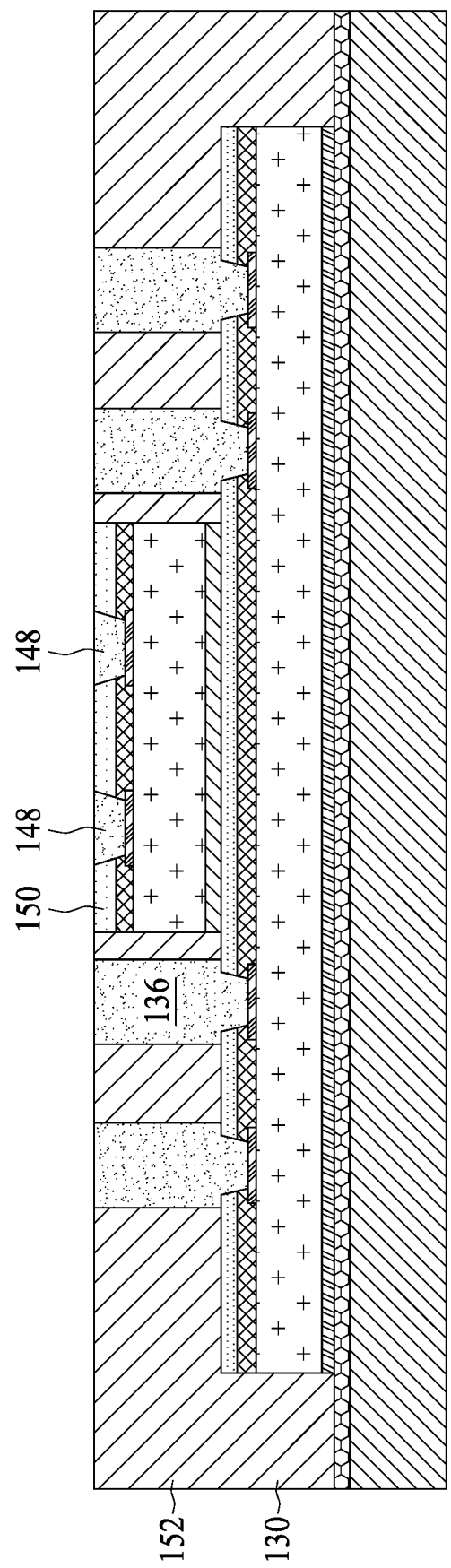

In FIG. 9, an encapsulant 152 is formed on the various components. The encapsulant 152 may be a molding compound, epoxy, or the like, and may be applied by compression molding, transfer molding, or the like. After curing, the encapsulant 152 can undergo a grinding process to expose the through vias 136 and the die connectors 148. Top surfaces of the through vias 136, the die connectors 148, and the encapsulant 152 are co-planar after the grinding process. In some embodiments, the grinding may be omitted, for example, if the through vias 136 and the die connectors 126 are already exposed.

In FIGS. 10 through 20, a front side redistribution structure 172 is formed. As will be illustrated in FIG. 20, the front side redistribution structure 172 includes dielectric layers 154, 162, 166, and 170 and metallization patterns 158, 160, 164, and 168.

Figure 10:
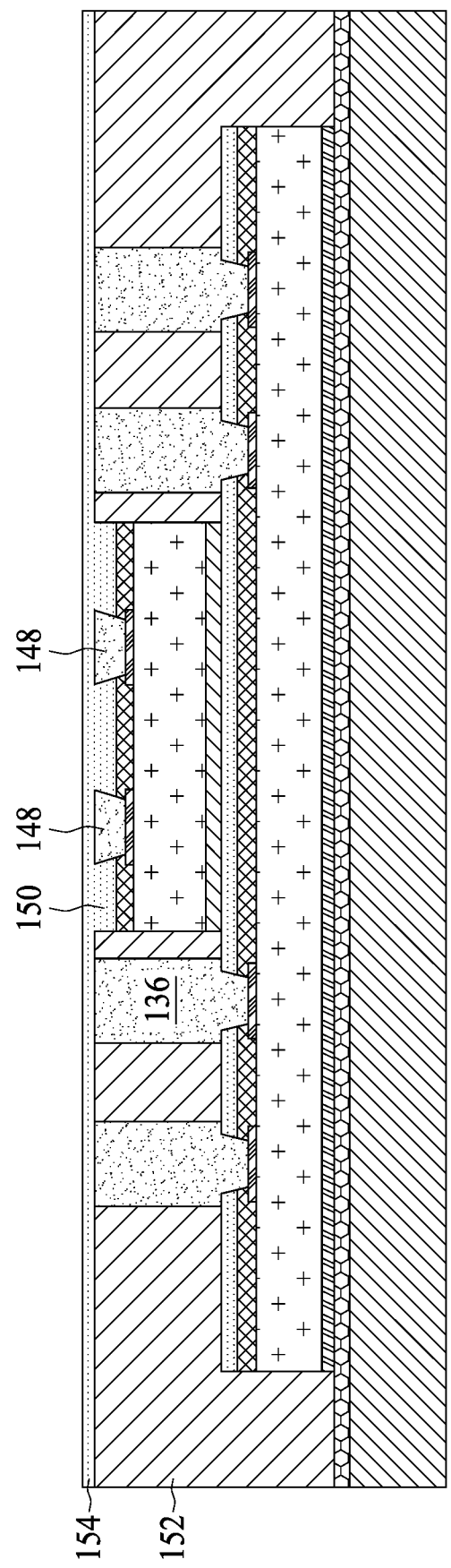

In FIG. 10, the dielectric layer 154 is deposited on the encapsulant 152, through vias 136, and die connectors 148. In some embodiments, the dielectric layer 154 is formed of a polymer, which may be a photo-sensitive material such as PBO, polyimide, BCB, or the like, that may be patterned using a lithography mask. In other embodiments, the dielectric layer 154 is formed of a nitride such as silicon nitride; an oxide such as silicon oxide, PSG, BSG, BPSG; or the like. The dielectric layer 154 may be formed by spin coating, lamination, CVD, the like, or a combination thereof.

Figure 11:
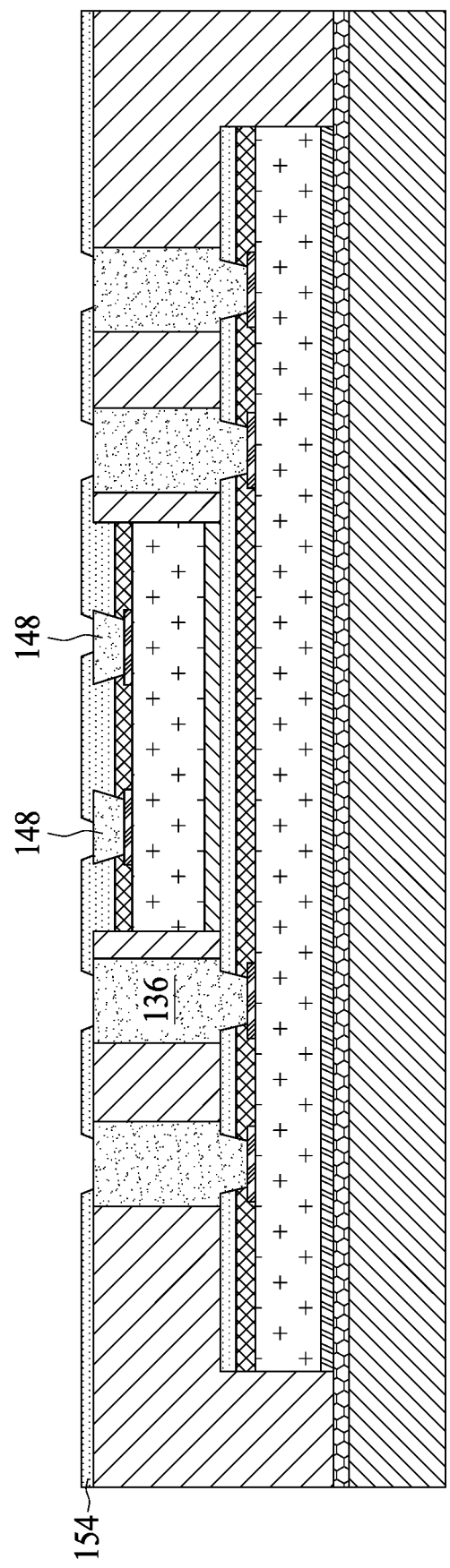

In FIG. 11, the dielectric layer 154 is then patterned. The patterning forms openings to expose portions of the through vias 136 and the die connectors 148. The patterning may be by an acceptable process, such as by exposing the dielectric layer 154 to light when the dielectric layer 154 is a photo-sensitive material or by etching using, for example, an anisotropic etch. If the dielectric layer 154 is a photo-sensitive material, the dielectric layer 154 can be developed after the exposure.

Figure 12A:
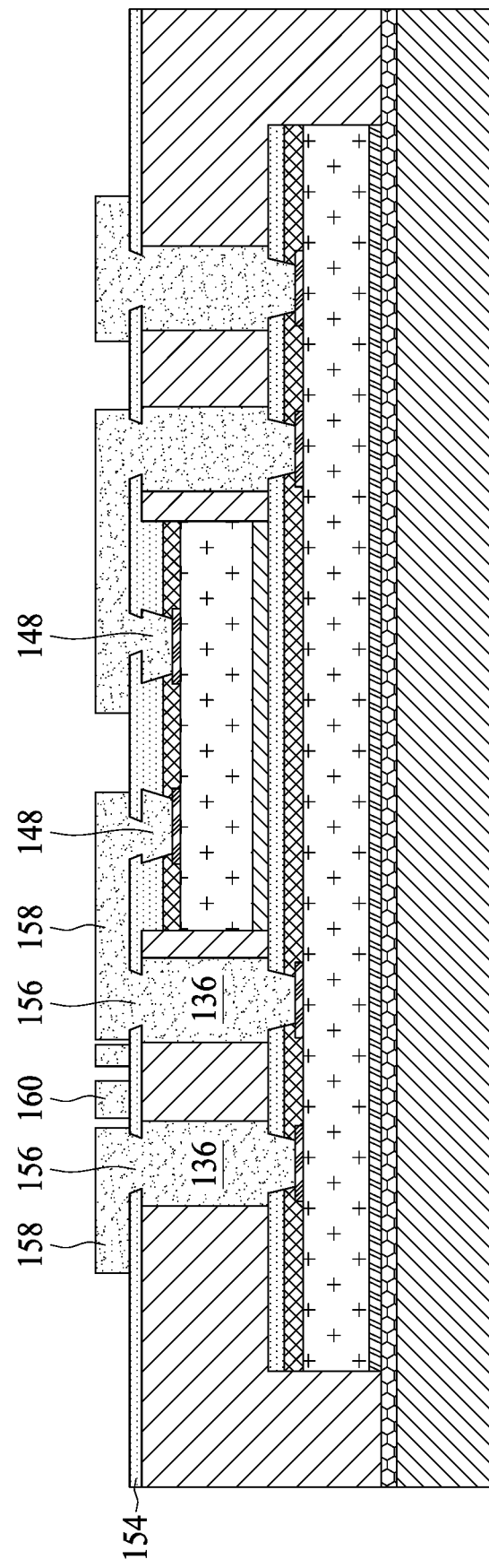

In FIG. 12A, metallization pattern 158 and 160 with vias is formed on the dielectric layer 154. As an example to form metallization pattern 158 and 160, a seed layer (not shown) is formed over the dielectric layer 154 and in openings through the dielectric layer 154. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization patterns 158 and 160. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 158 and 160 and vias 156. The vias 156 are formed in openings through the dielectric layer 154 to, e.g., the through vias 136 and/or the die connectors 148.

Figure 12B:
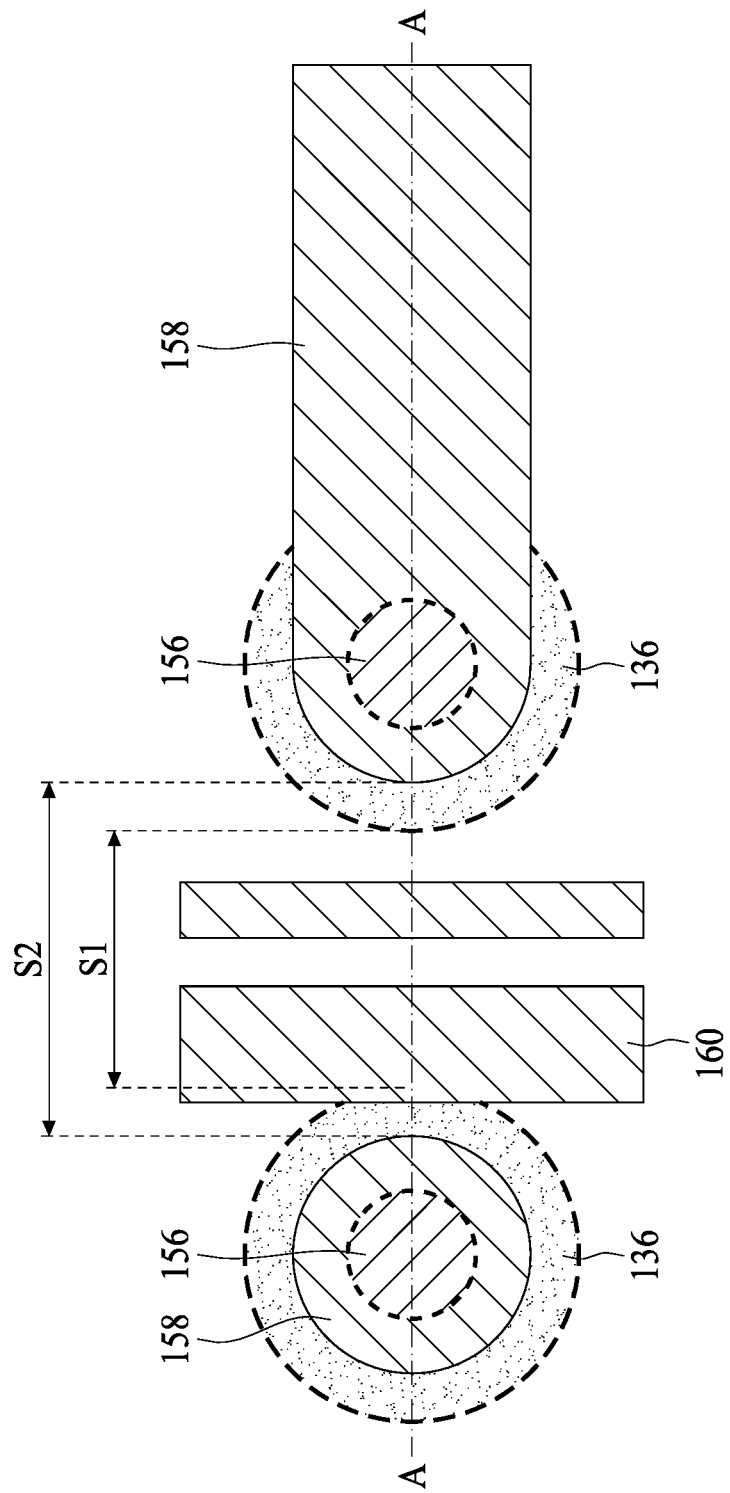

FIG. 12B is a top view of the structure in FIG. 12A with the structure in FIG. 12A being along line A-A of FIG. 12B. The metallization patterns 160 may be referred to as routing lines 160. In some embodiments, the routing lines 160 pass between adjacent metallization patterns 158, which are coupled to adjacent through vias 136.

In some embodiments, the sidewalls of adjacent through vias 136 are separated by a spacing S1 and the sidewalls of corresponding adjacent metallization patterns 158 are separated by a spacing S2, with the spacing S2 being greater than the spacing S1. In other words, the metallization patterns 158 are smaller (at least in a diameter from a center of the through via 136) than the through vias 136 (see FIG. 12B). By having the greater spacing S2, there is more room for the routing lines 160 to pass between the adjacent metallization patterns 158. This may allow for more and/or wider routing lines 160 to pass between adjacent metallization patterns 158.

Figure 13:
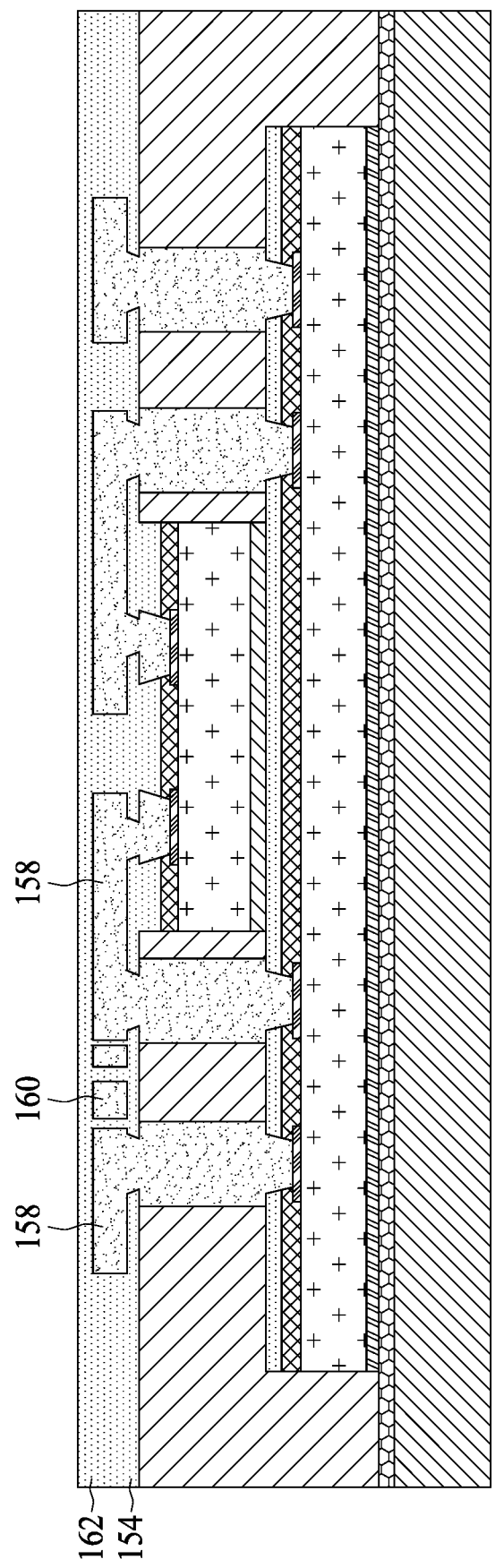

In FIG. 13, the dielectric layer 162 is deposited on the metallization patterns 158 and 160 and the dielectric layer 154. In some embodiments, the dielectric layer 62 is formed of a polymer, which may be a photo-sensitive material such as PBO, polyimide, BCB, or the like, that may be patterned using a lithography mask. In other embodiments, the dielectric layer 162 is formed of a nitride such as silicon nitride; an oxide such as silicon oxide, PSG, BSG, BPSG; or the like. The dielectric layer 162 may be formed by spin coating, lamination, CVD, the like, or a combination thereof.

Figure 14:
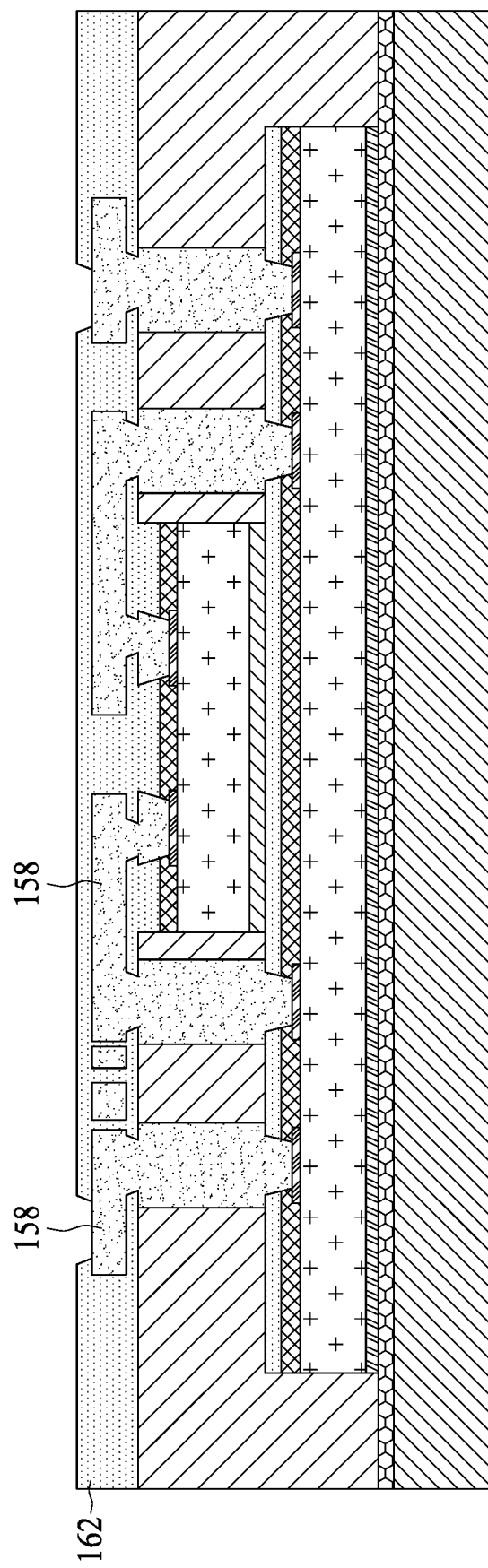

In FIG. 14, the dielectric layer 162 is then patterned. The patterning forms openings to expose portions of the metallization pattern 158. The patterning may be by an acceptable process, such as by exposing the dielectric layer 162 to light when the dielectric layer is a photo-sensitive material or by etching using, for example, an anisotropic etch. If the dielectric layer 162 is a photo-sensitive material, the dielectric layer 162 can be developed after the exposure.

Figure 15:
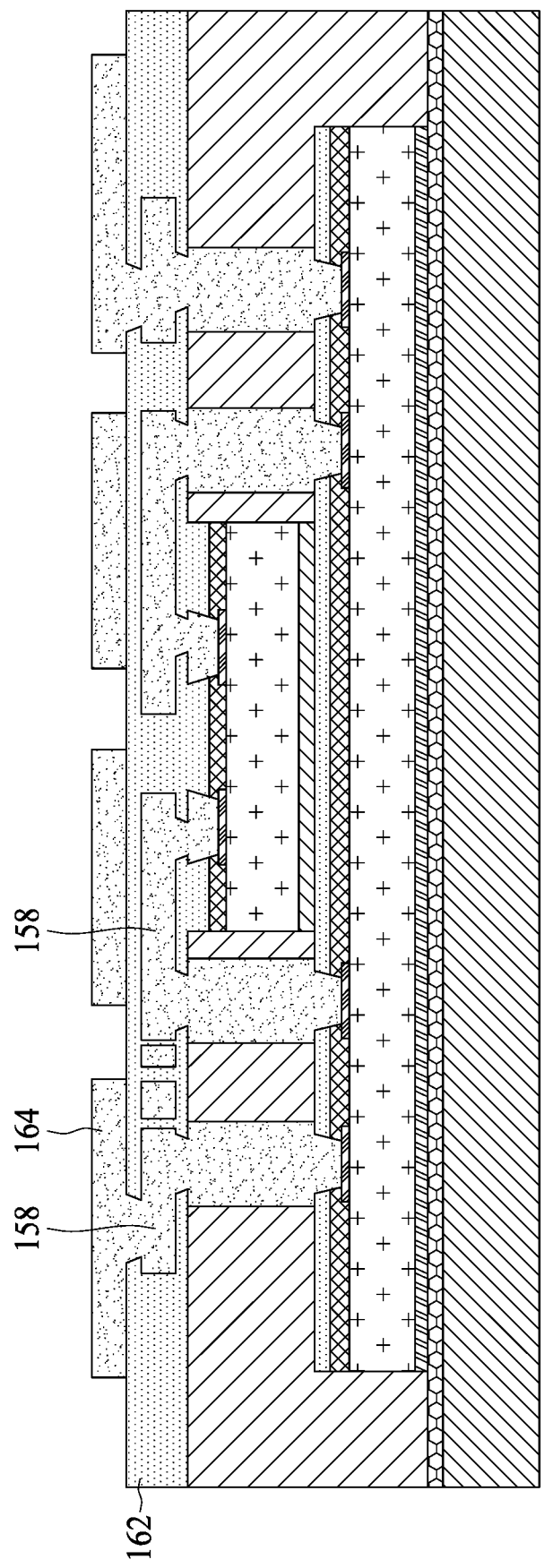

In FIG. 15, metallization pattern 164 with vias is formed on the dielectric layer 162. As an example to form metallization pattern 164, a seed layer (not shown) is formed over the dielectric layer 162 and in openings through the dielectric layer 162. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 164. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 164 and vias. The vias are formed in openings through the dielectric layer 162 to, e.g., portions of the metallization pattern 158.

Figure 16:
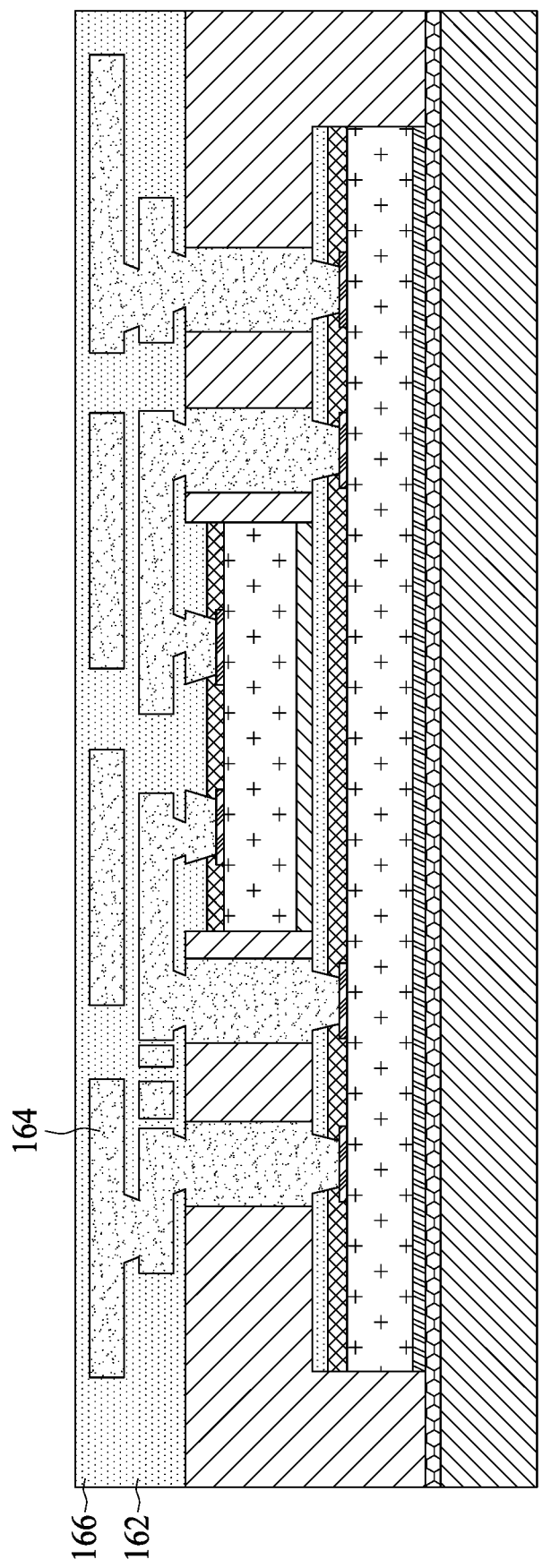

In FIG. 16, the dielectric layer 166 is deposited on the metallization pattern 164 and the dielectric layer 162. In some embodiments, the dielectric layer 166 is formed of a polymer, which may be a photo-sensitive material such as PBO, polyimide, BCB, or the like, that may be patterned using a lithography mask. In other embodiments, the dielectric layer 166 is formed of a nitride such as silicon nitride; an oxide such as silicon oxide, PSG, BSG, BPSG; or the like. The dielectric layer 166 may be formed by spin coating, lamination, CVD, the like, or a combination thereof.

Figure 17:
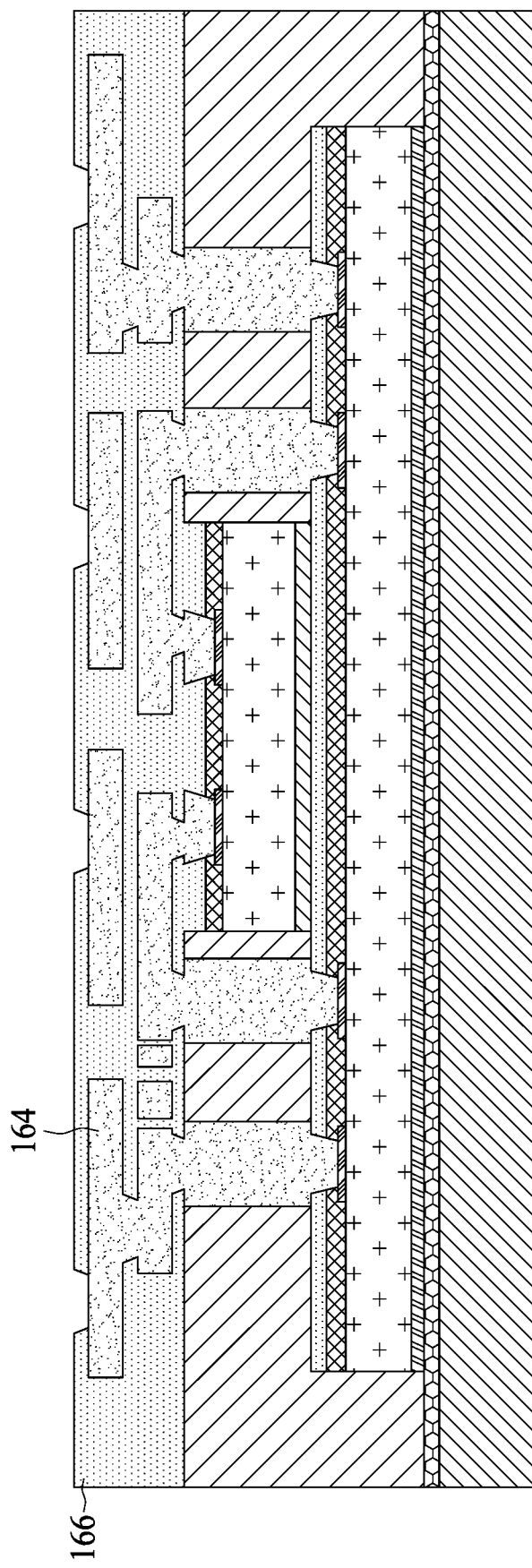

In FIG. 17, the dielectric layer 166 is then patterned. The patterning forms openings to expose portions of the metallization pattern 164. The patterning may be by an acceptable process, such as by exposing the dielectric layer 166 to light when the dielectric layer is a photo-sensitive material or by etching using, for example, an anisotropic etch. If the dielectric layer 166 is a photo-sensitive material, the dielectric layer 166 can be developed after the exposure.

Figure 18:
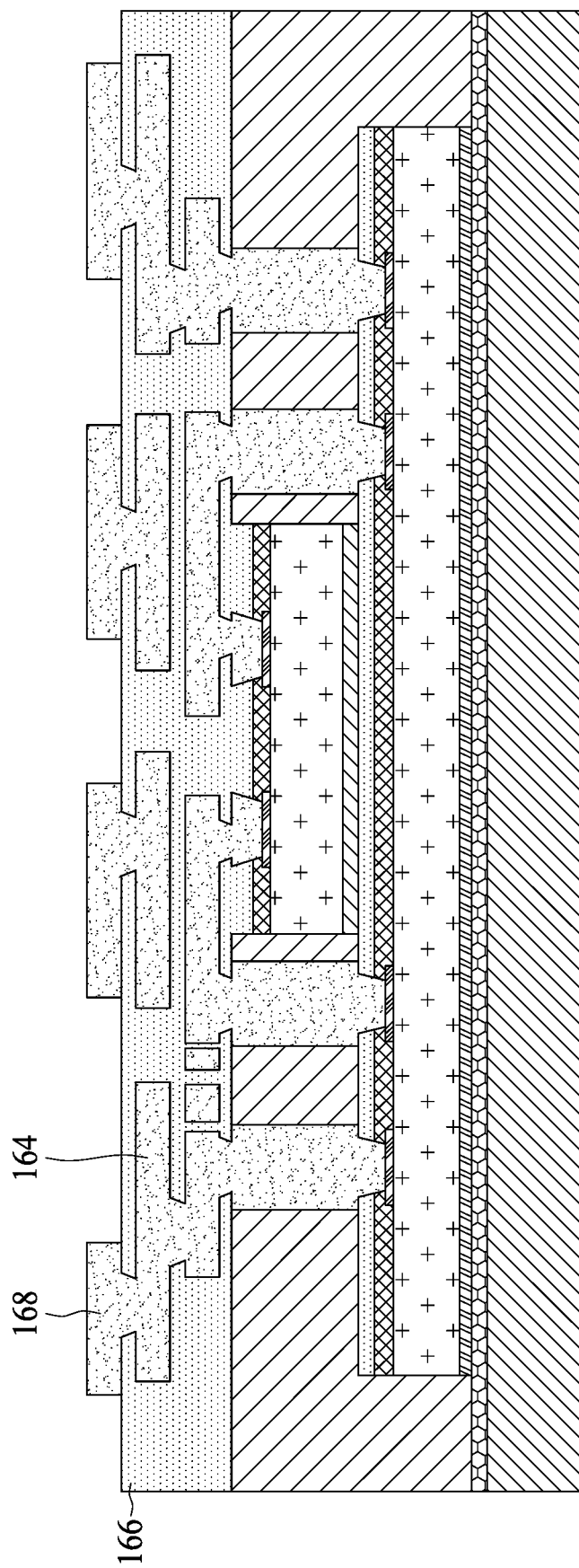

In FIG. 18, metallization pattern 168 with vias is formed on the dielectric layer 166. As an example to form metallization pattern 168, a seed layer (not shown) is formed over the dielectric layer 166 and in openings through the dielectric layer 166. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 168. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 168 and vias. The vias are formed in openings through the dielectric layer 166 to, e.g., portions of the metallization pattern 164.

Figure 19:
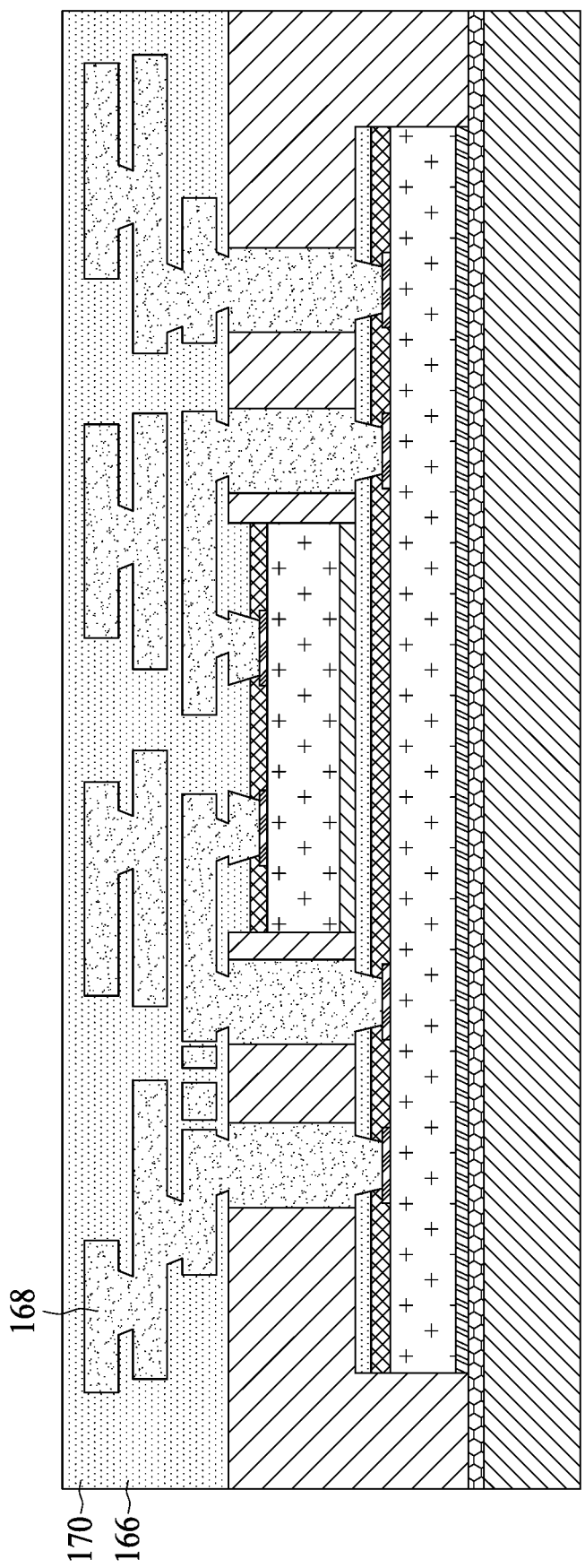

In FIG. 19, the dielectric layer 170 is deposited on the metallization pattern 168 and the dielectric layer 166. In some embodiments, the dielectric layer 170 is formed of a polymer, which may be a photo-sensitive material such as PBO, polyimide, BCB, or the like, that may be patterned using a lithography mask. In other embodiments, the dielectric layer 170 is formed of a nitride such as silicon nitride; an oxide such as silicon oxide, PSG, BSG, BPSG; or the like. The dielectric layer 170 may be formed by spin coating, lamination, CVD, the like, or a combination thereof.

Figure 20:
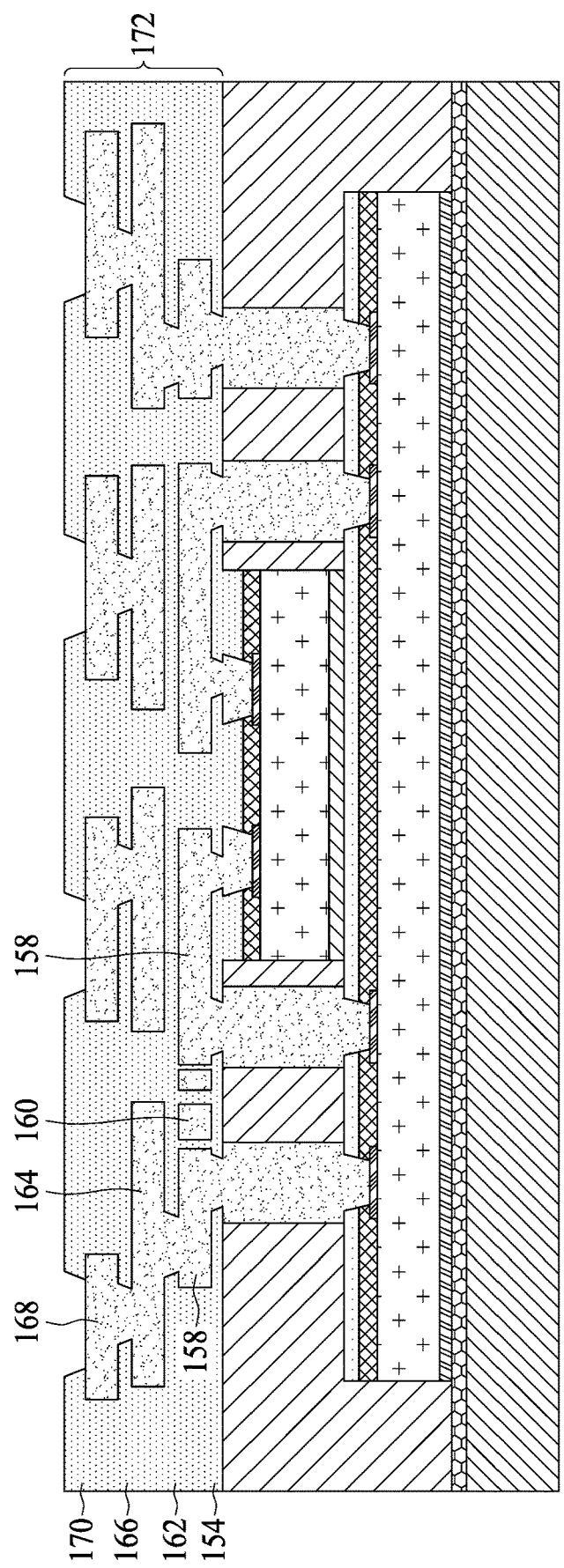

In FIG. 20, the dielectric layer 170 is then patterned. The patterning forms openings to expose portions of the metallization pattern 168. The patterning may be by an acceptable process, such as by exposing the dielectric layer 170 to light when the dielectric layer is a photo-sensitive material or by etching using, for example, an anisotropic etch. If the dielectric layer 170 is a photo-sensitive material, the dielectric layer 170 can be developed after the exposure.

The front side redistribution structure 172 is shown as an example. More or fewer dielectric layers and metallization patterns may be formed in the front side redistribution structure 172. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 21:
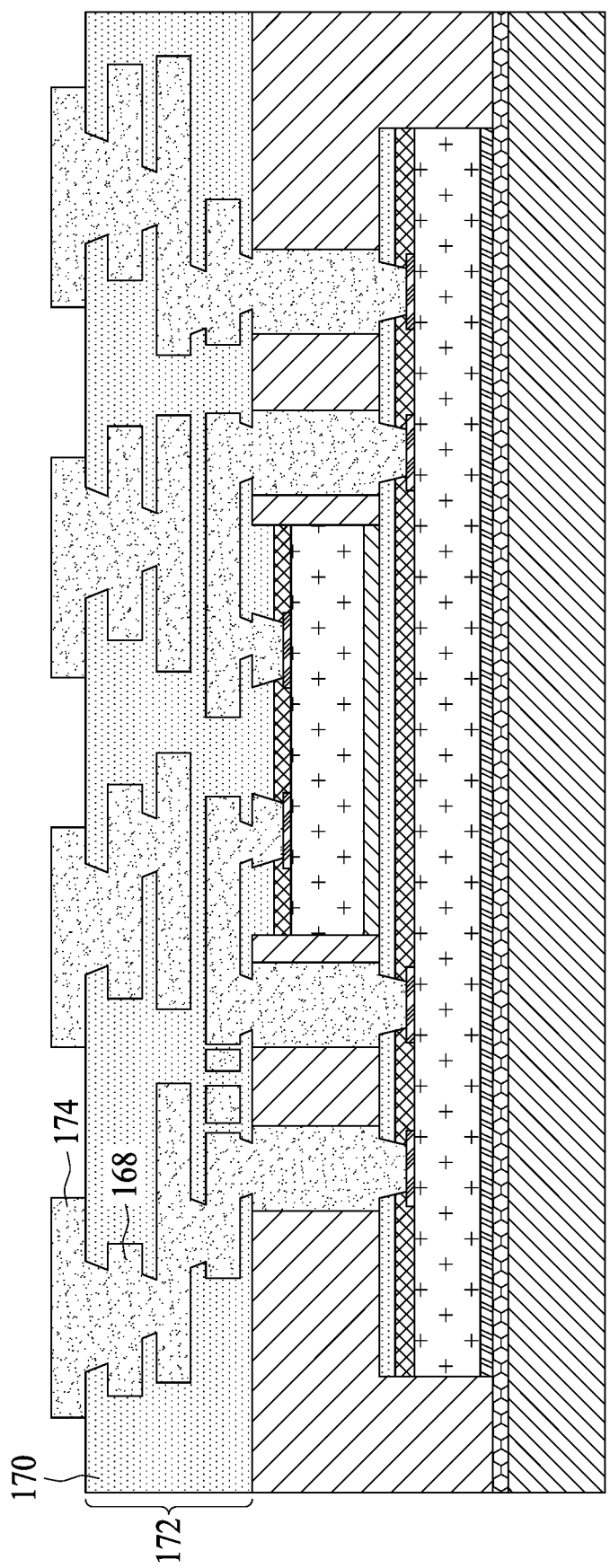

In FIG. 21, pads 174, which may be referred to as under bump metallurgies (UBMs), are formed on an exterior side of the front side redistribution structure 172. In the illustrated embodiment, pads 174 are formed through openings through the dielectric layer 170 to the metallization pattern 168. As an example to form the pads 174, a seed layer (not shown) is formed over the dielectric layer 170. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 174. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 174.

Figure 22:
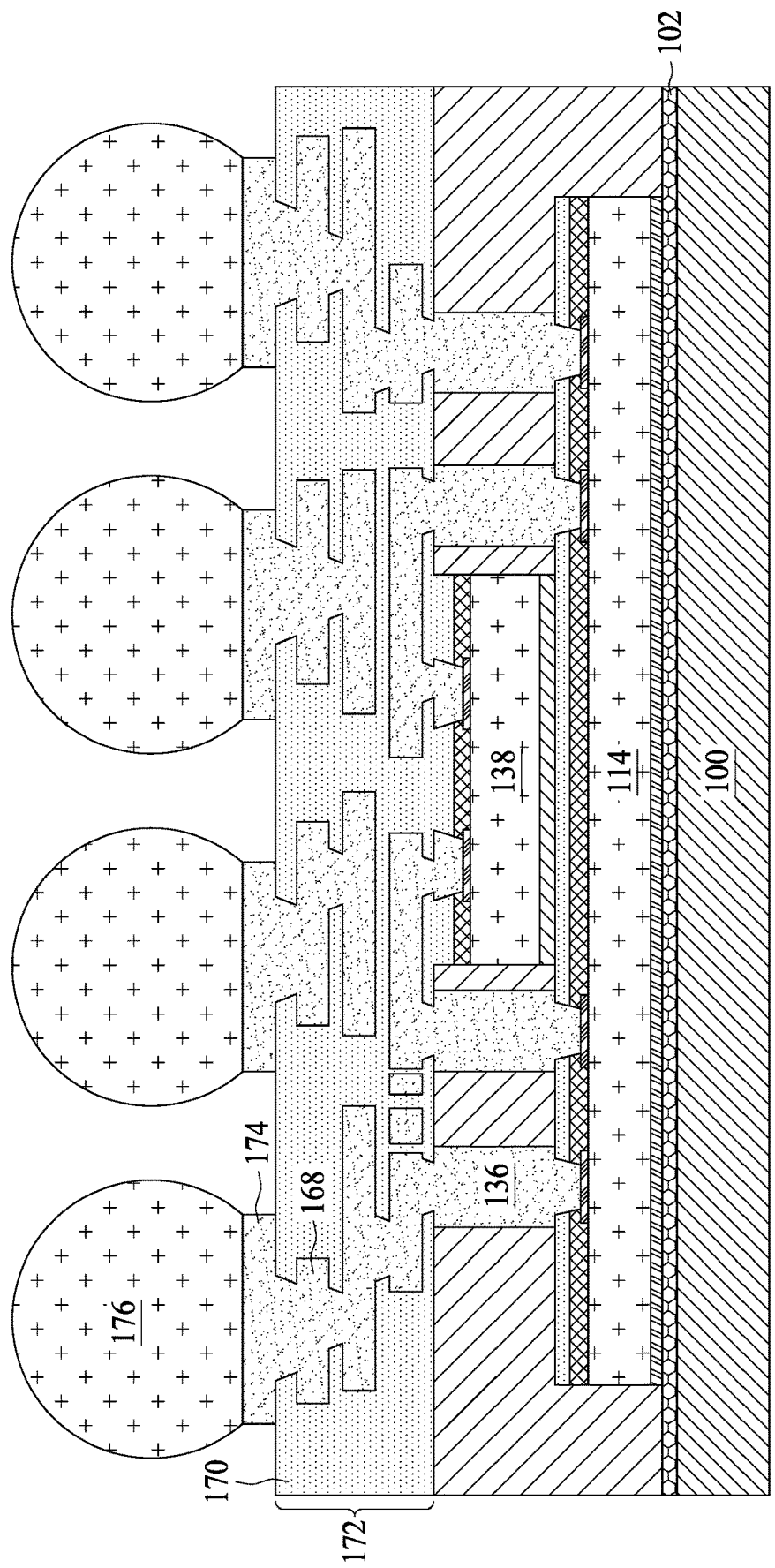

In FIG. 22, external electrical connectors 176, such as solder balls like ball grid array (BGA) balls, are formed on the pads 174. The external electrical connectors 176 may include a low-temperature reflowable material such as solder, which may be lead-free or lead-containing. The external electrical connectors 176 may be formed by using an appropriate ball drop process. In some embodiments, the pads 174 can be omitted, and the external electrical connectors 176 can be formed directly on the metallization pattern 168 through the openings through the dielectric layer 170.

After FIG. 22, a carrier substrate de-bonding may be performed to detach (de-bond) the carrier substrate 100 from the package structure. In accordance with some embodiments, the de-bonding includes projecting a light such as a laser light or an UV light on the release layer 102 so that the release layer 102 decomposes under the heat of the light and the carrier substrate 100 can be removed.

The structure may further undergo a singulation process by sawing along scribe line regions e.g., between adjacent package structures. The resulting package structure after the carrier de-bonding and the optional singulation may be referred to as an integrated fan-out (InFO) package.

FIGS. 23 through 28, 29A-B, and 30 are views of intermediate steps during a process for forming a package structure in accordance with another embodiment. This embodiment is similar to the previous embodiment of FIGS. 1 through 11, 12A-B, and 13 through 22 except that in this embodiment, the through vias 136 have a first portion 136A and a second portion 136B with the second portion having a smaller width than the first portion 136A. Further, the views of this embodiment only show a portion of the package structure (e.g. the left hand portion of the package structure and excluding the carrier substrate below) being formed but a similar process and structure can be formed adjacent this structure that will result in a similar overall structure to that illustrated in the previous embodiment of FIG. 22. Details regarding this embodiment that are similar to those for the previously described embodiment will not be repeated herein.

Figure 23:
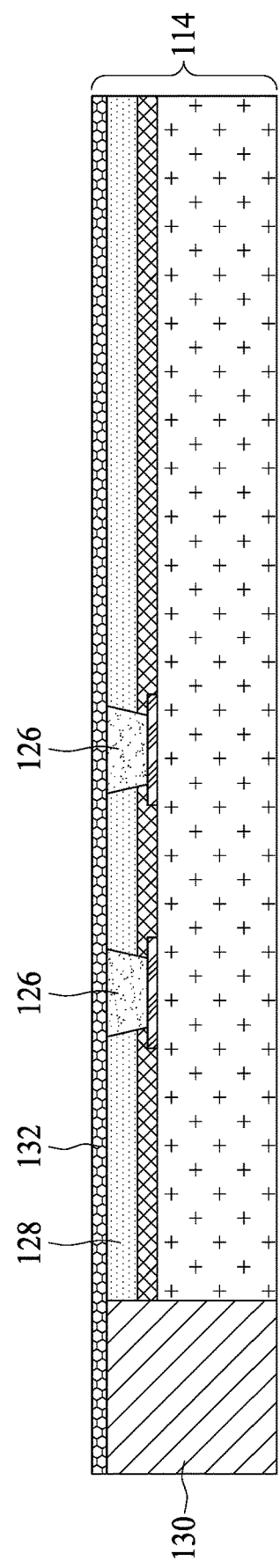
FIGS. 23 through 28, 29A-B, and 30 are views of intermediate steps during a process for forming a package structure in accordance with another embodiment.

FIG. 23 is at a similar point of processing as FIG. 4 described above and the processes and steps performed up until this point are not repeated herein. FIG. 23 includes the integrated circuit die 114, die connectors 126, dielectric material 128, encapsulant 130, and seed layer 132.

Figure 24:
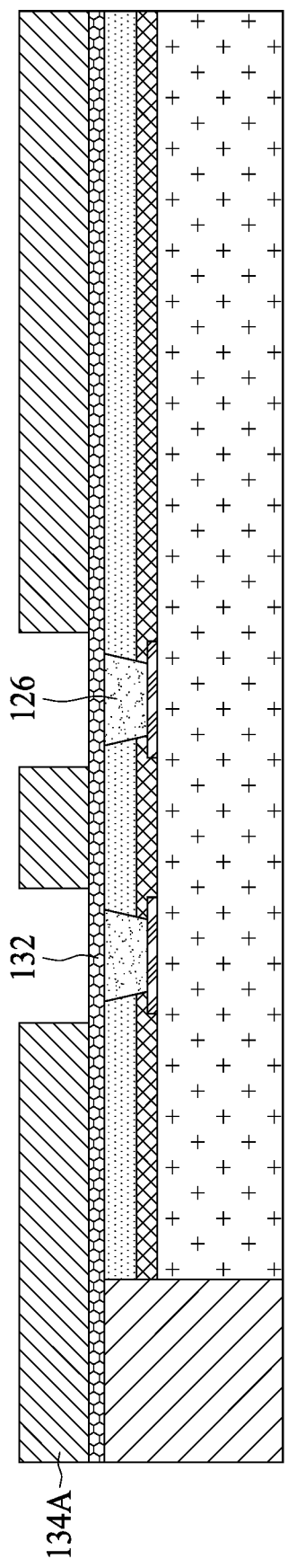

In FIG. 24, a photo resist 134A is then formed and patterned on the seed layer 132. The photo resist 134A may be formed by spin coating or the like and may be exposed to light for patterning. The pattern of the photo resist 134A corresponds to the die connectors 126. The patterning forms openings through the photo resist 134A to expose the seed layer 132 over the die connectors 126.

Figure 25:
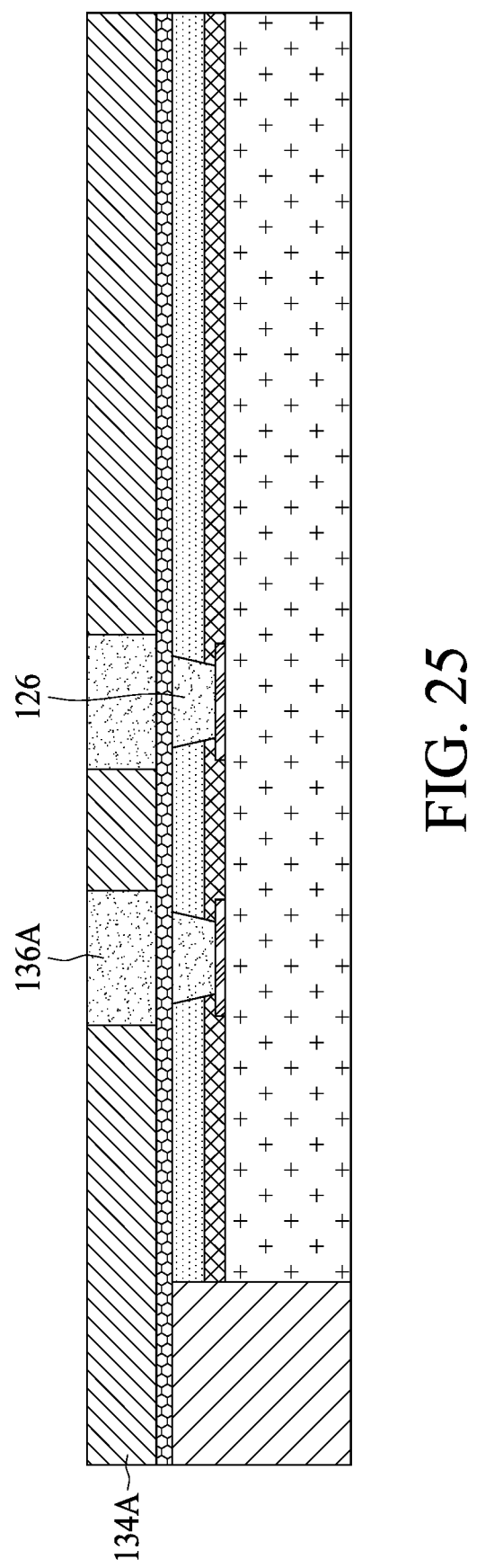

In FIG. 25, a conductive material is formed in the openings of the photo resist 134A and on the exposed portions of the seed layer 132 to form conductive features 136A. The conductive material may be formed by plating, such as electroplating or electroless plating, or the like. The conductive material may comprise a metal, like copper, titanium, tungsten, aluminum, or the like.

Figure 26:
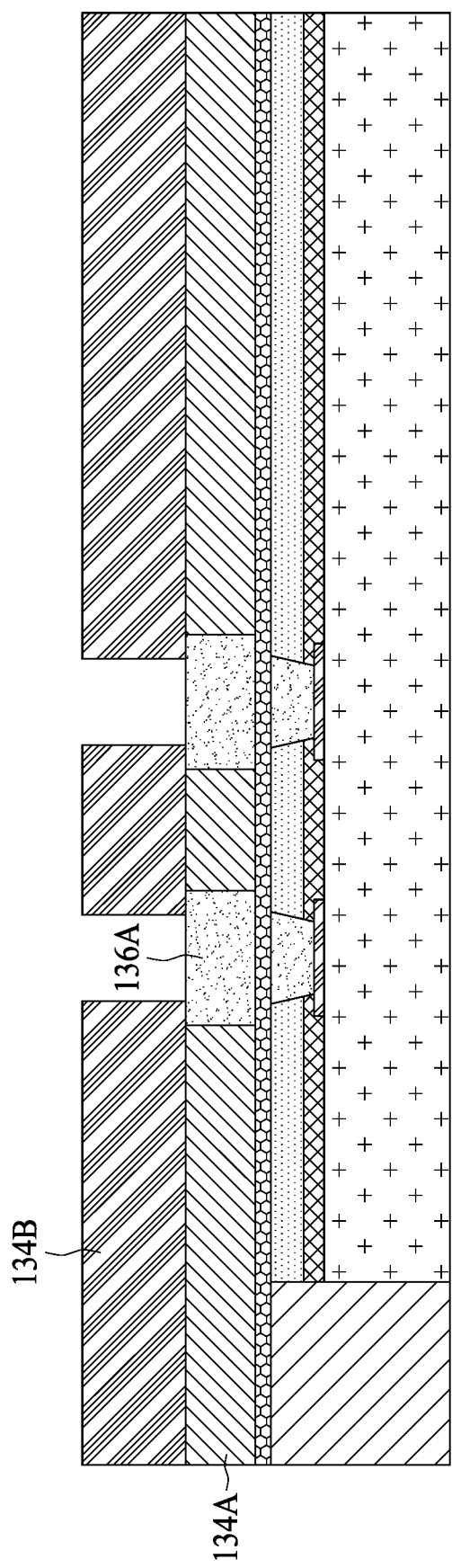

In FIG. 26, a photo resist 134B is then formed and patterned on the photo resist 134A and the conductive features 136A. The photo resist 134B may be formed by spin coating or the like and may be exposed to light for patterning. The pattern of the photo resist 134B corresponds to the conductive features 136A. The patterning forms openings through the photo resist 134B to expose the conductive features 136A.

Figure 27:
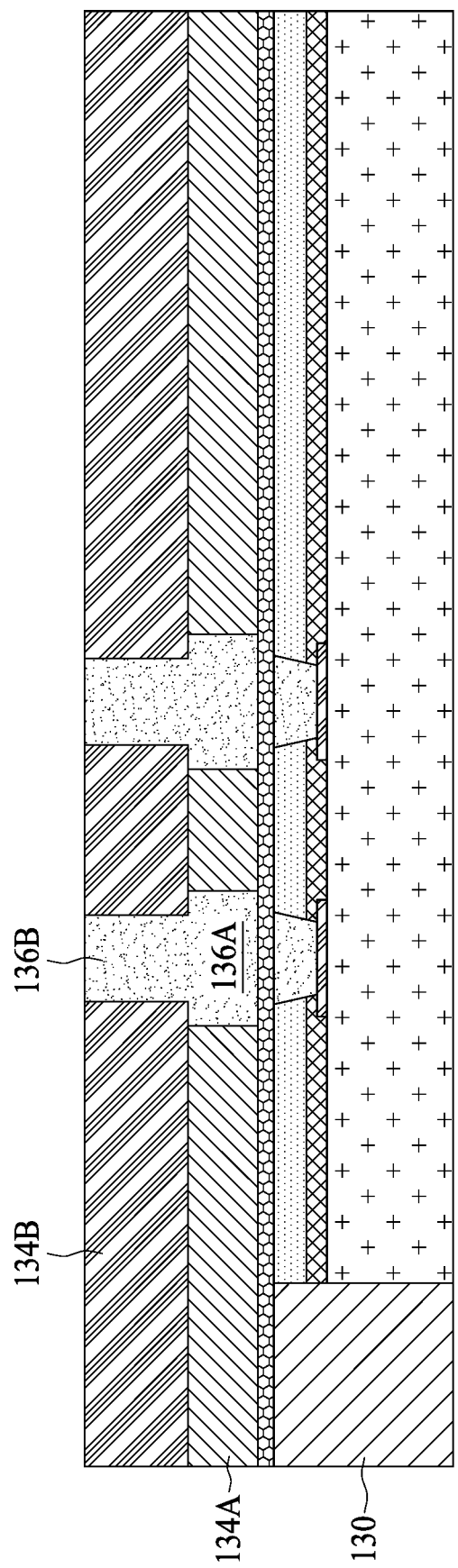

In FIG. 27, a conductive material is formed in the openings of the photo resist 134B and on the exposed portions of the conductive features 136A to form conductive features 136B. The conductive material may be formed by plating, such as electroplating or electroless plating, or the like. The conductive material may comprise a metal, like copper, titanium, tungsten, aluminum, or the like. The conductive features 136A and 136B together form conductive features 136 (through vias 136). In this embodiment, the first portion 136A is wider than the second portion 136B of the through vias 136. This smaller second portion (upper portion) 136B of the through vias 136 allows for a greater spacing S1 (see FIG. 29B) between sidewalls of adjacent second portions 136B, which also enables a greater spacing S2 between sidewalls of corresponding adjacent metallization patterns 158. As illustrated in FIG. 27, two through vias 136 are formed over and coupled to the integrated circuit die 114, and in other embodiments, more or less through vias 136 may be formed over and coupled to the integrated circuit die 114.

Figure 28:
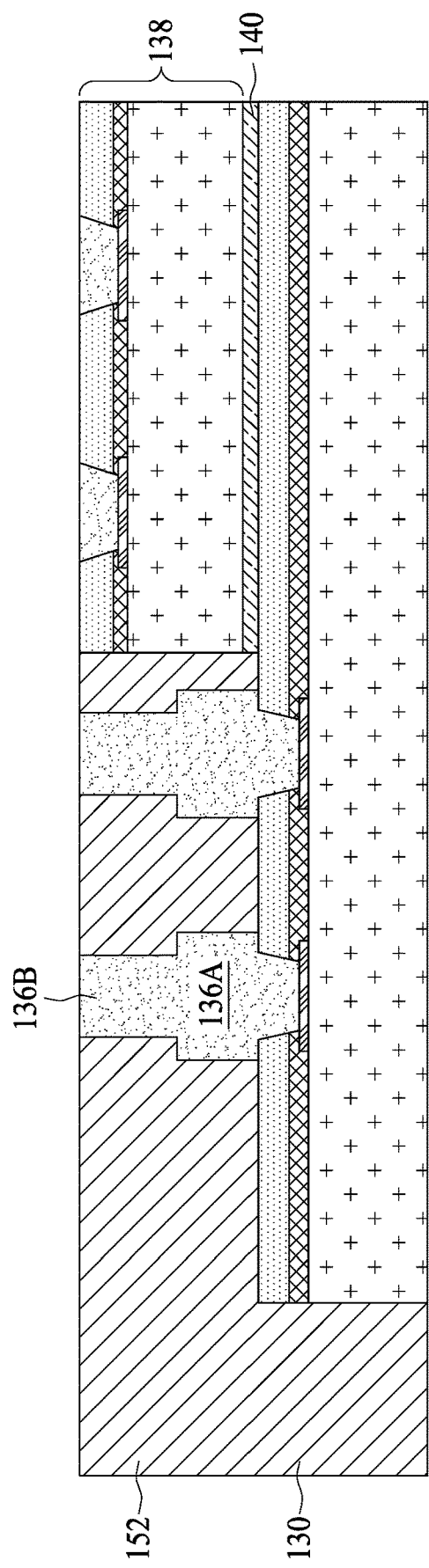
Figure 29A:
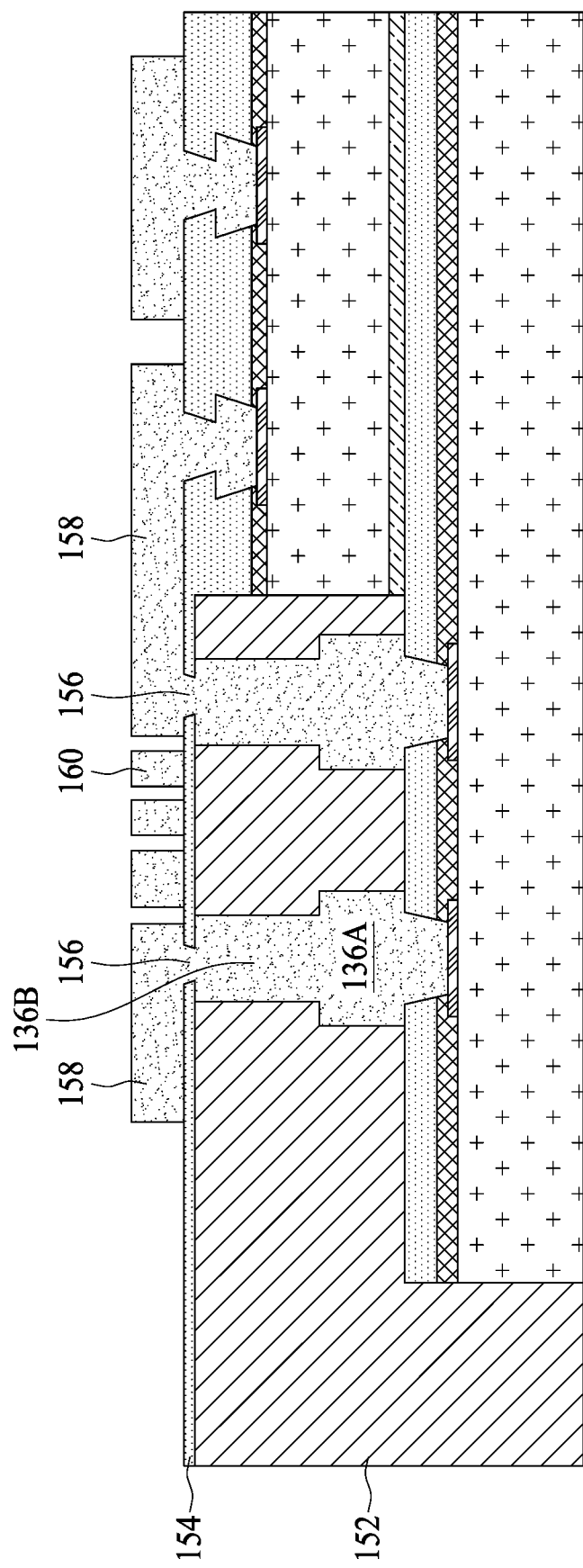
Figure 29B:
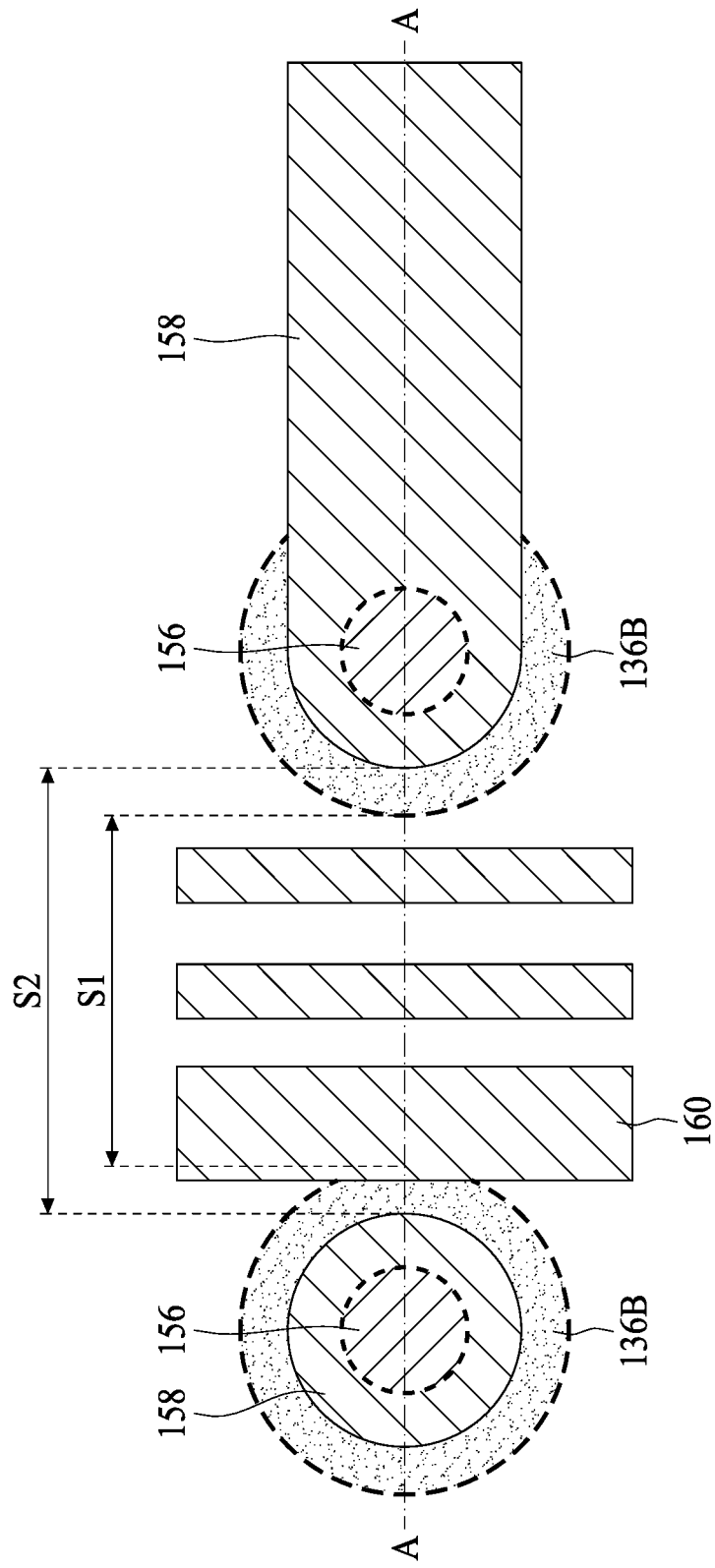

In FIG. 28, the integrated circuit die 138 and encapsulant 152 has been attached and formed as described above in FIGS. 8 and 9 and the descriptions are not repeated herein. In FIGS. 29A and 29B, the dielectric layer 154, the metallization patterns 158, the vias 156, and the routing lines 160 are formed as described above in reference to FIGS. 10, 11, and 12A-B except that in this embodiment the spacings S1 and S2 may be larger than in FIG. 12A-B due to the smaller widths of the second portions 136B of the through vias 136. Hence, in this embodiment, there may be more routing lines 160 between the adjacent metallization patterns 158 due to the increased spacings S1 and S2.

Figure 30:
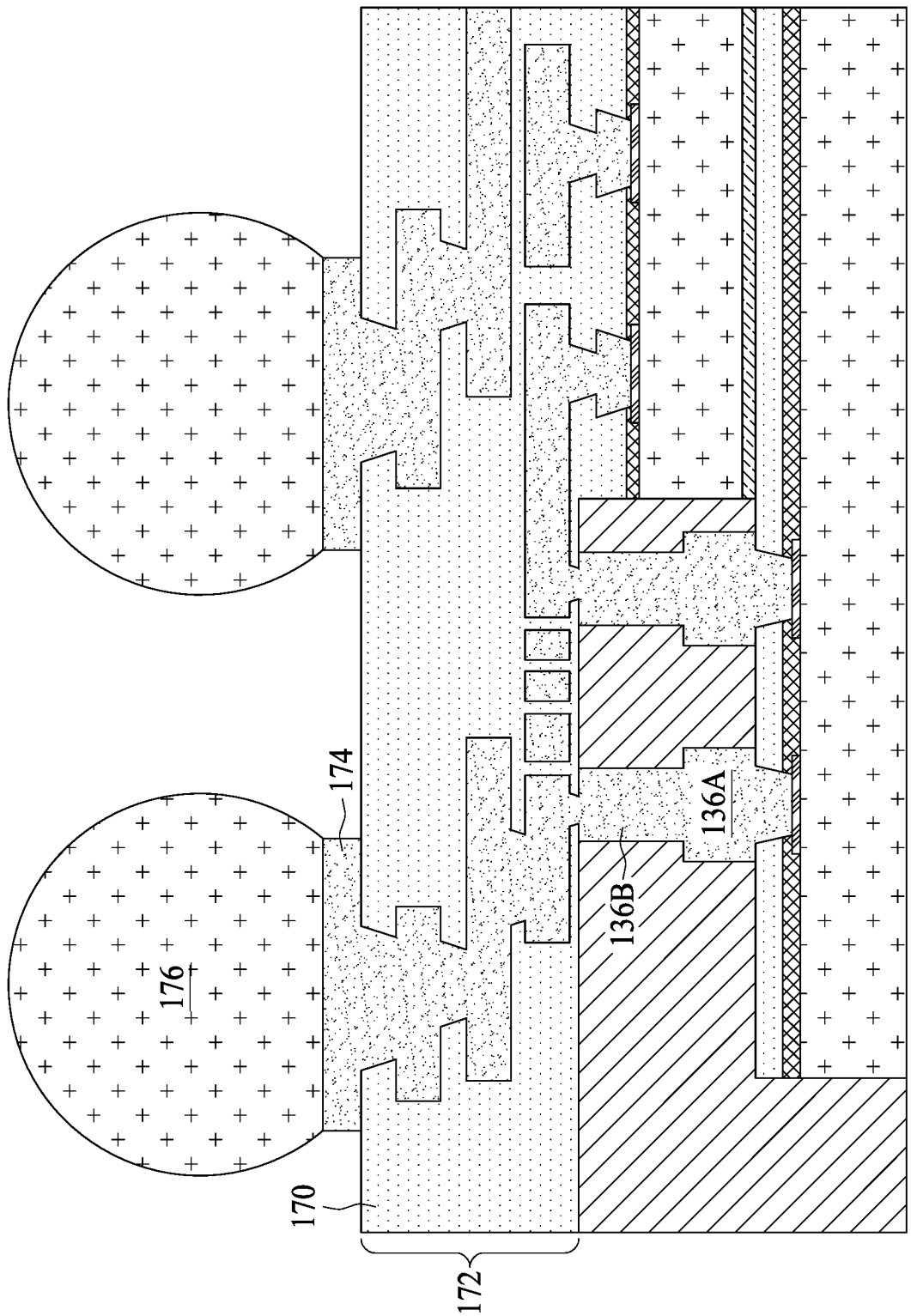

In FIG. 30, the processing continues to form the front side redistribution structure 172, the pads 174, and the connectors 176. The steps and processes to form the front side redistribution structure 172, the pads 174, and the connectors 176 may be similar to the steps and processes described above in FIGS. 13 through 22 and the description is not repeated herein.

FIGS. 31 through 37, 38A-B, and 39 are views of intermediate steps during a process for forming a package structure in accordance with another embodiment. This embodiment is similar to the previous embodiments except that, in this embodiment, at least one of the through vias 136 is formed on a redistribution layer (see 190 in FIG. 37). Further, as in the previous embodiment, the views of this embodiment only show a portion of the package structure (e.g. the left hand portion of the package structure without the carrier substrate below) being formed but a similar process and structure can be formed adjacent this structure that will result in a similar overall structure to that illustrated in the previous embodiment of FIG. 22. Details regarding this embodiment that are similar to those for the previously described embodiment will not be repeated herein.

Figure 31:
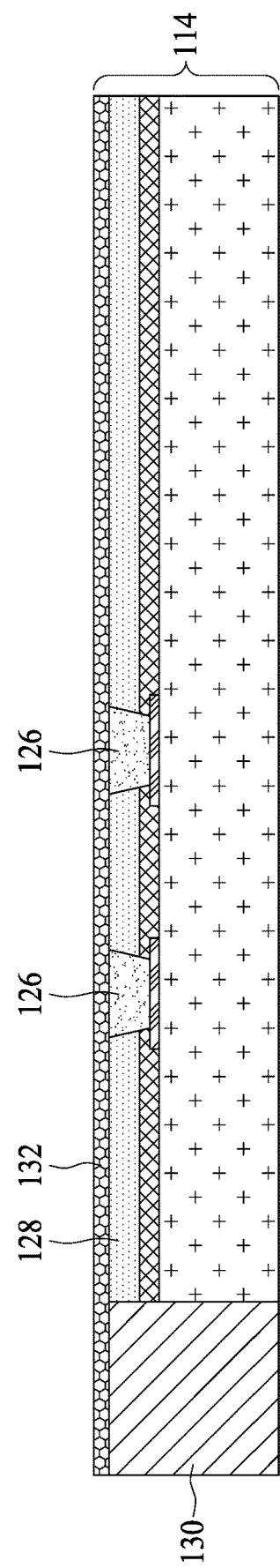
FIGS. 31 through 37, 38A-B, and 39 are views of intermediate steps during a process for forming a package structure in accordance with another embodiment.

FIG. 31 is at a similar point of processing as FIG. 4 described above and the processes and steps performed up until this point are not repeated herein. FIG. 31 includes the integrated circuit die 114, die connectors 126, dielectric material 128, encapsulant 130, and seed layer 132.

Figure 32:
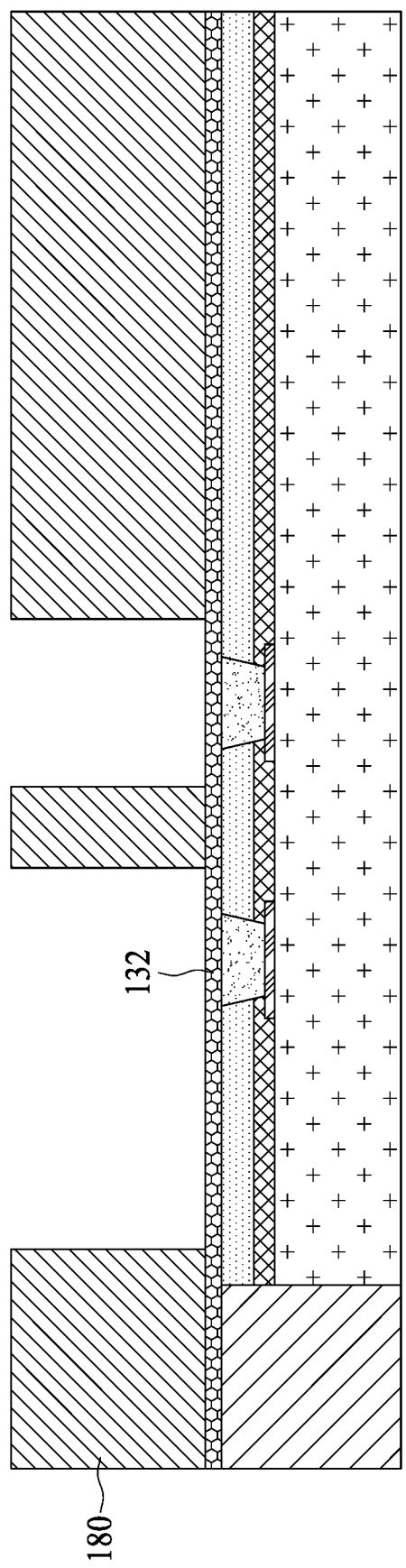

In FIG. 32, a photo resist 180 is then formed and patterned on the seed layer 132. The photo resist 180 may be formed by spin coating or the like and may be exposed to light for patterning. The pattern of the photo resist 180 corresponds to the die connectors 126 with at least one of the openings being wider than at least one other of the openings to correspond to the subsequently formed redistribution layer 190. The patterning forms openings through the photo resist 180 to expose the seed layer 132 over the die connectors 126.

Figure 33:
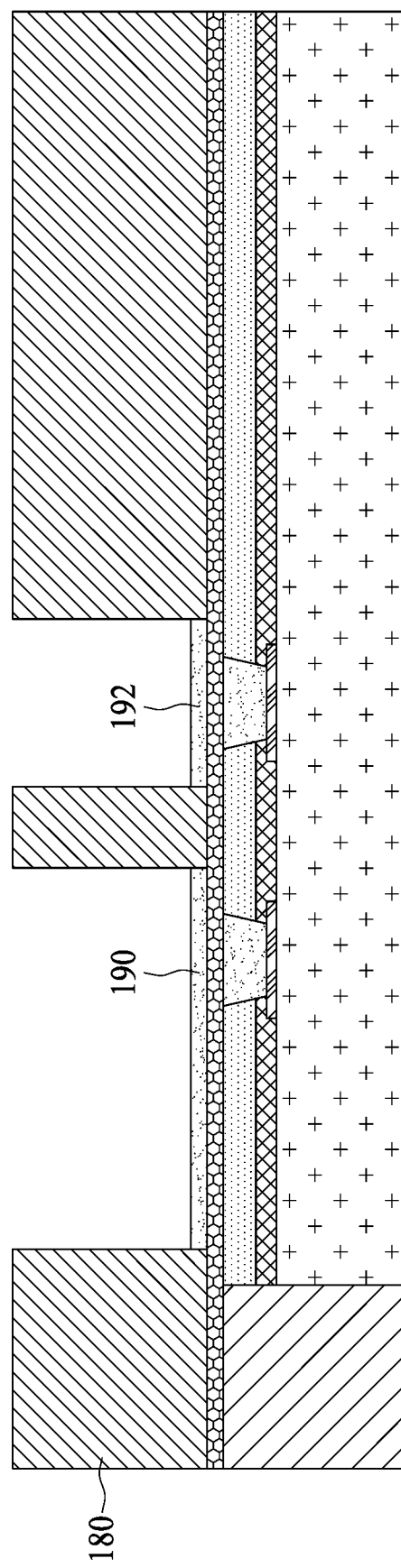

In FIG. 33, a conductive material is formed in the openings of the photo resist 180 and on the exposed portions of the seed layer 132 to form conductive features 190 and 192. The conductive material may be formed by plating, such as electroplating or electroless plating, or the like. The conductive material may comprise a metal, like copper, titanium, tungsten, aluminum, or the like. In some embodiments, the conductive feature 190 is larger (e.g. wider in the cross sectional view of FIG. 33 and/or having a greater top surface area) than the conductive feature 192. The conductive feature 190 forms a redistribution layer 190 to allow for the subsequently formed corresponding through via 136 to be laterally moved and provide more space between adjacent through vias 136, which allows for greater spacings S1 and S2 (see FIG. 38A-B).

Figure 34:
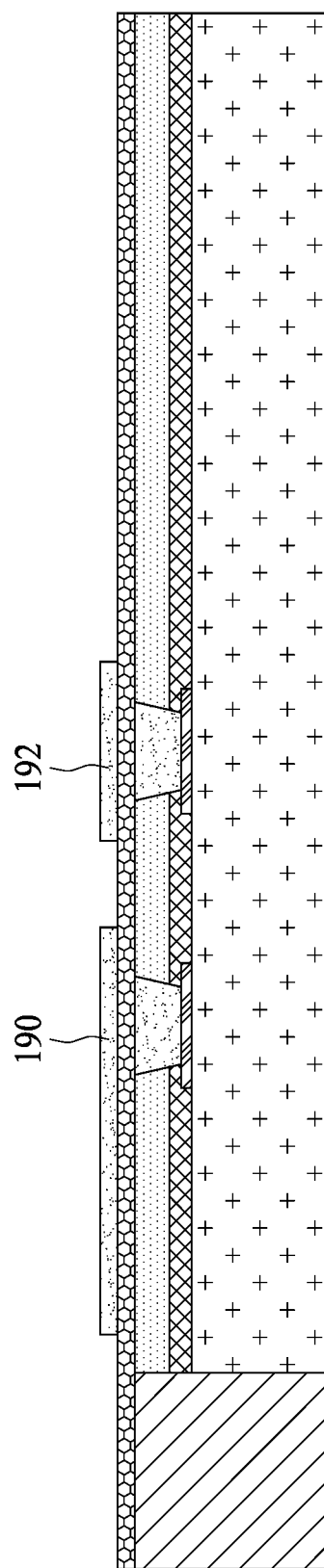

In FIG. 34, the photo resist 180 is removed. The photo resist 180 may be removed by an acceptable ashing or stripping process, such as using an oxygen plasma or the like.

Figure 35:
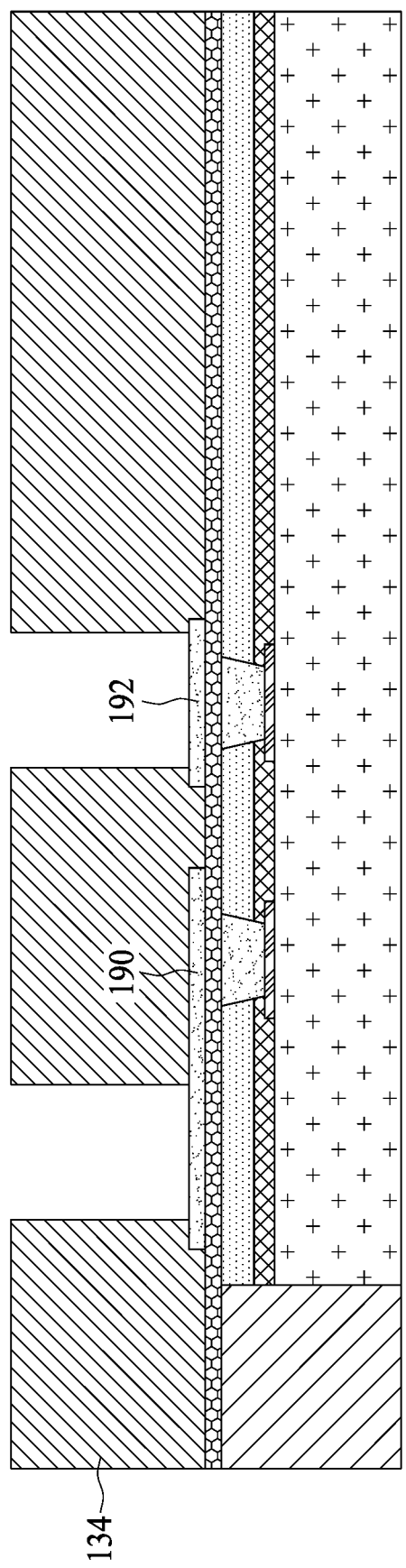

In FIG. 35, a photo resist 134 is then formed and patterned on the conductive features 190 and 192. The photo resist 134 may be formed by spin coating or the like and may be exposed to light for patterning. The pattern of the photo resist 134 corresponds to the conductive features 190 and 192. The patterning forms openings through the photo resist 134 to expose the conductive features 190 and 192.

Figure 36:
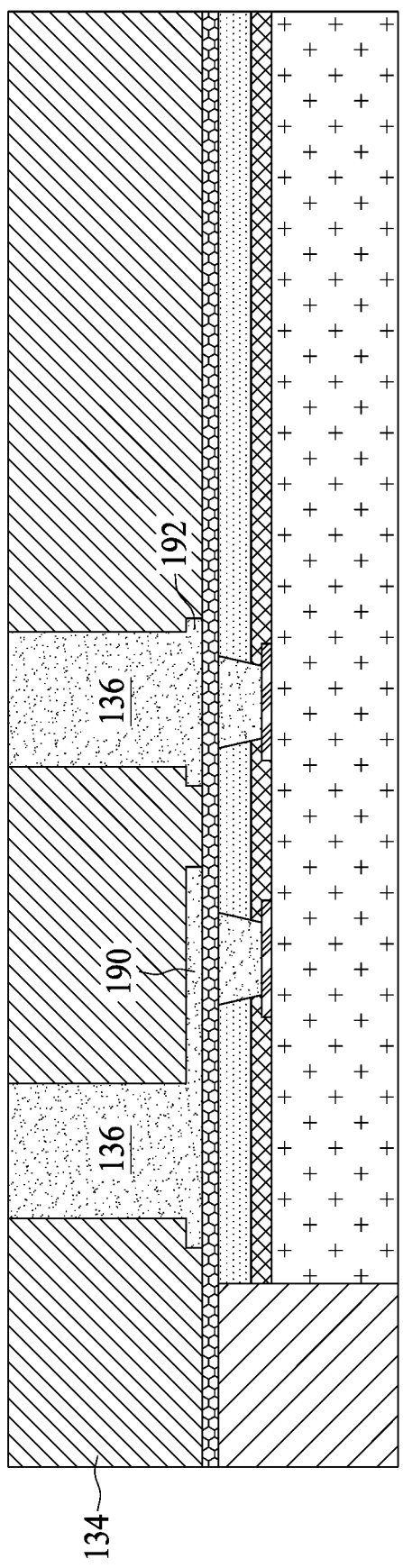

In FIG. 36, a conductive material is formed in the openings of the photo resist 134 and on the exposed portions of the conductive features 190 and 192 to form through vias 136. The conductive material may be formed by plating, such as electroplating or electroless plating, or the like. The conductive material may comprise a metal, like copper, titanium, tungsten, aluminum, or the like.

Figure 37:
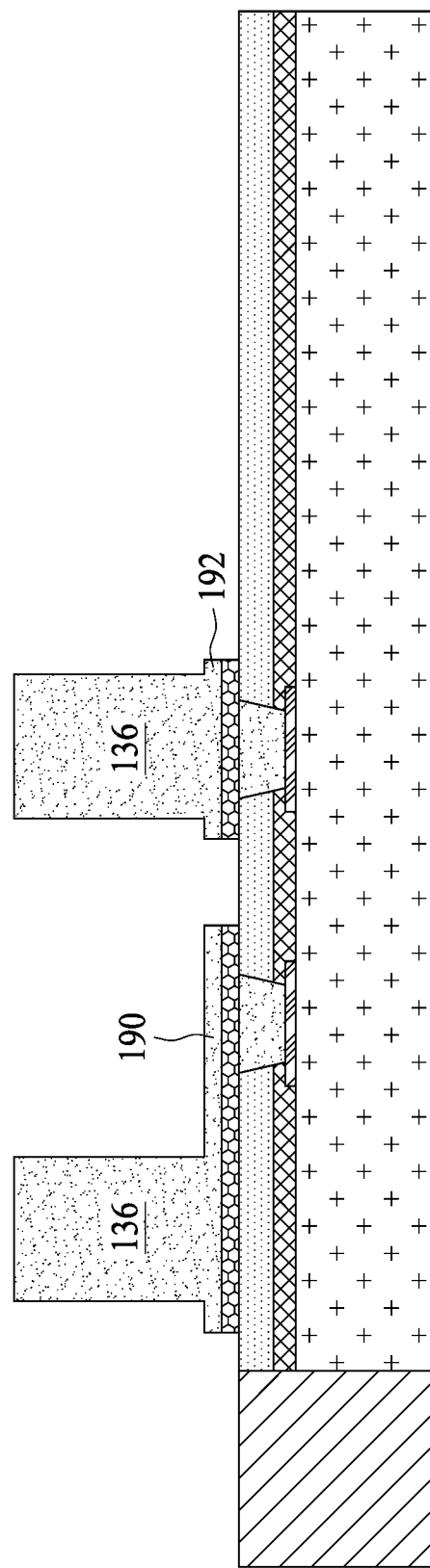

In FIG. 37, the photo resist 134 and portions of the seed layer 132 on which the conductive features 190 and 192 are not formed are removed. The photo resist 134 may be removed by an acceptable ashing or stripping process, such as using an oxygen plasma or the like. Once the photo resist 134 is removed, exposed portions of the seed layer 132 are removed, such as by using an acceptable etching process, such as by wet or dry etching. The remaining portions of the seed layer 132 and conductive material form the through vias 136 and the conductive features 190 and 192. As illustrated in FIG. 37, two through vias 136 and one redistribution layer 190 are formed over and coupled to the integrated circuit die 114, and in other embodiments, more or less through vias 136 and/or redistribution layers 190 may be formed over and coupled to the integrated circuit die 114.

The conductive feature 190 forms a redistribution layer 190 to allow for the corresponding through vias 136 to be laterally moved and provide more space between adjacent through vias 136. This greater space between adjacent through vias 136 allows for a greater spacing S1 (see FIG. 38B) between sidewalls of adjacent through vias 136, which also enables a greater spacing S2 between sidewalls of corresponding adjacent metallization patterns 158. Further, in this embodiment, the redistribution layer 190 may be used redistribute some input/output (I/O), such as, for example, a power line and a ground line (see, e.g., FIGS. 46A-C).

Figure 38A:
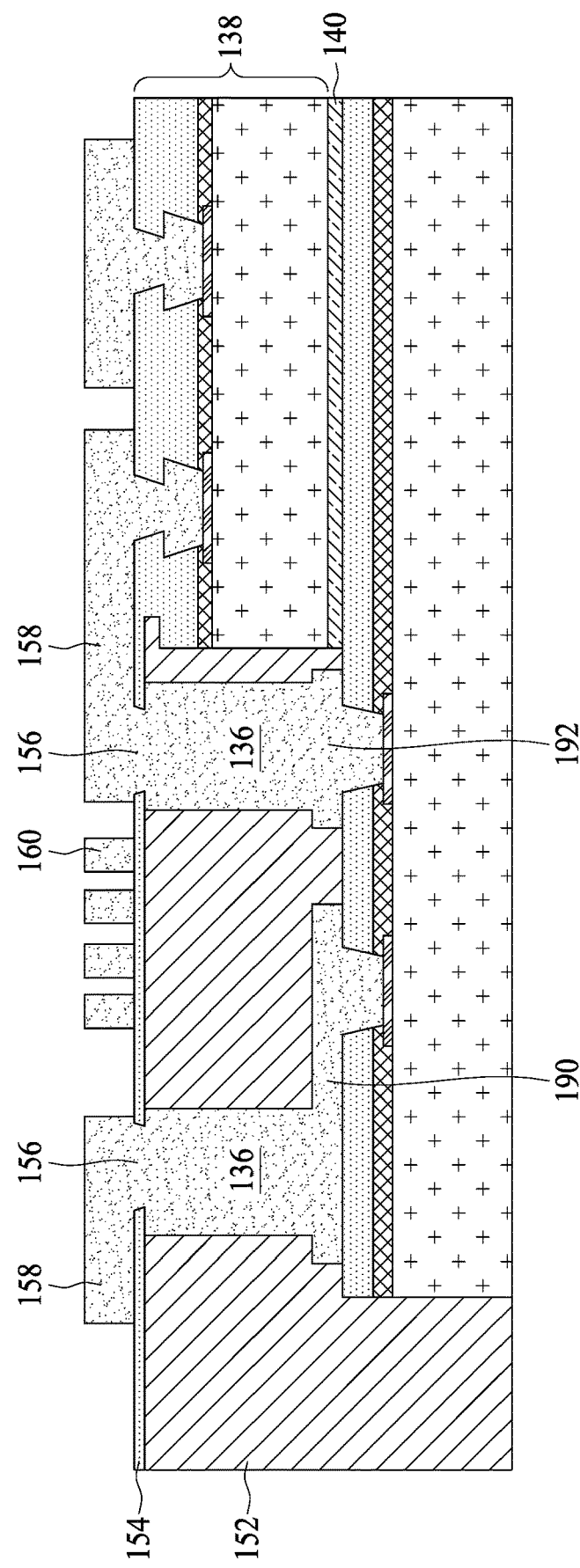
Figure 38B:
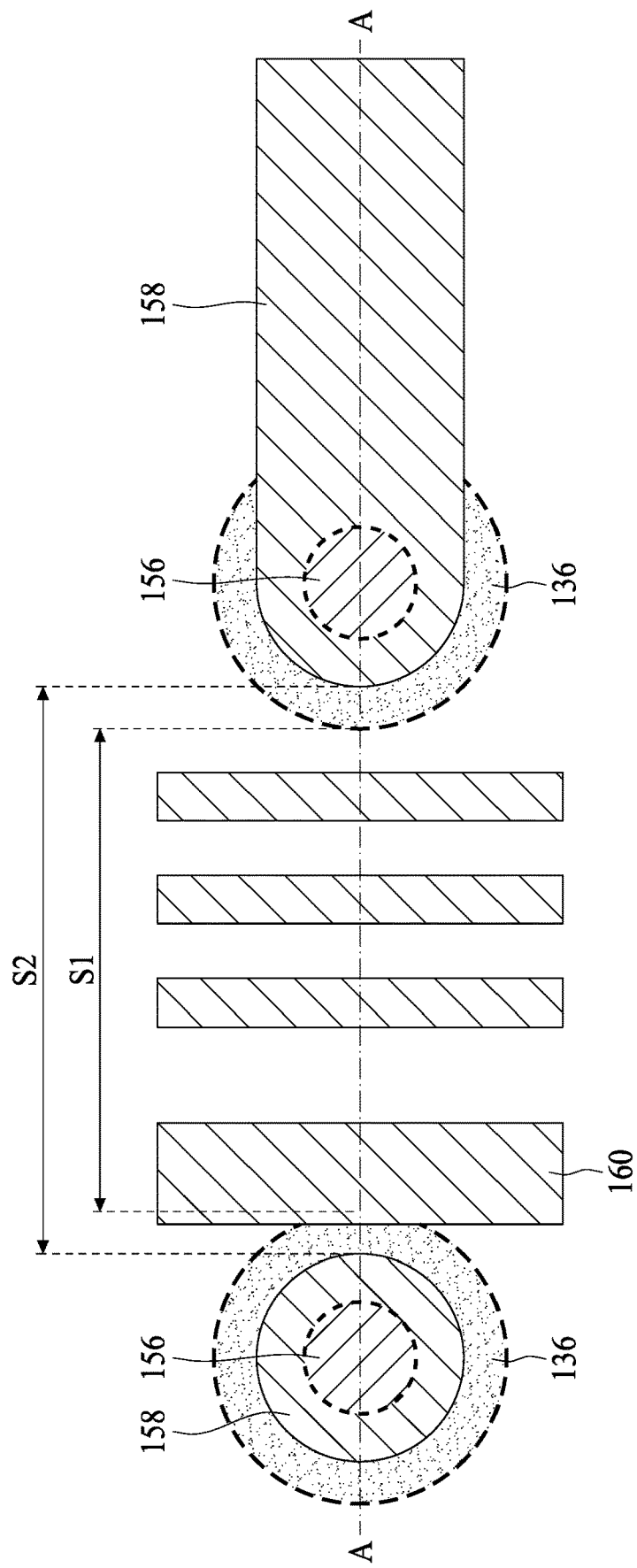

In FIGS. 38A and 38B, the integrated circuit die 138 and encapsulant 152 has been attached and formed as described above in FIGS. 8 and 9 and the descriptions are not repeated herein. Further, the dielectric layer 154, the metallization patterns 158, the vias 156, and the routing lines 160 are formed as described above in reference to FIGS. 10, 11, and 12A-B except that in this embodiment the spacings S1 and S2 may be larger than in FIG. 12A-B due to the redistribution layer 190 laterally moving at least one of the through vias 136. Hence, in this embodiment, there may be more routing lines 160 between the adjacent metallization patterns 158 due to the increased spacings S1 and S2.

Figure 39:
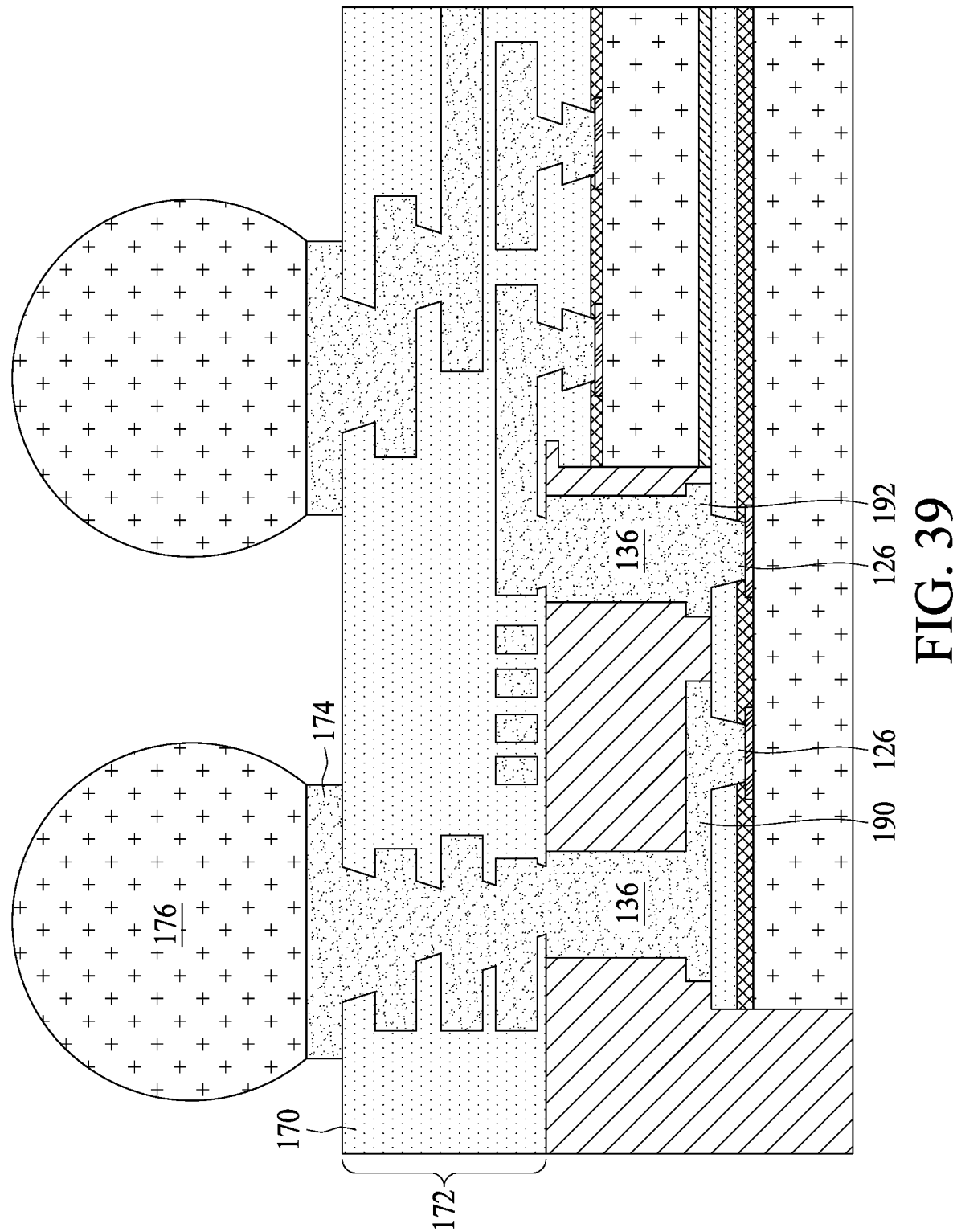

In FIG. 39, the processing continues to form the front side redistribution structure 172, the pads 174, and the connectors 176. The steps and processes to form the front side redistribution structure 172, the pads 174, and the connectors 176 may be similar to the steps and processes described above in FIGS. 13 through 22 and the description is not repeated herein.

FIGS. 40 through 43, 44A-B, and 45 are views of intermediate steps during a process for forming a package structure in accordance with another embodiment. This embodiment is similar to the previous embodiment except that, in this embodiment, at least one of the die connectors 126 is formed as a redistribution layer (see 198 in FIG. 40). Further, as in the previous embodiments, the views of this embodiment only show a portion of the package structure (e.g. the left hand portion of the package structure and excluding the carrier substrate below) being formed but a similar process and structure can be formed adjacent this structure that will result in a similar overall structure to that illustrated in the previous embodiment of FIG. 22. Details regarding this embodiment that are similar to those for the previously described embodiment will not be repeated herein.

Figure 40:
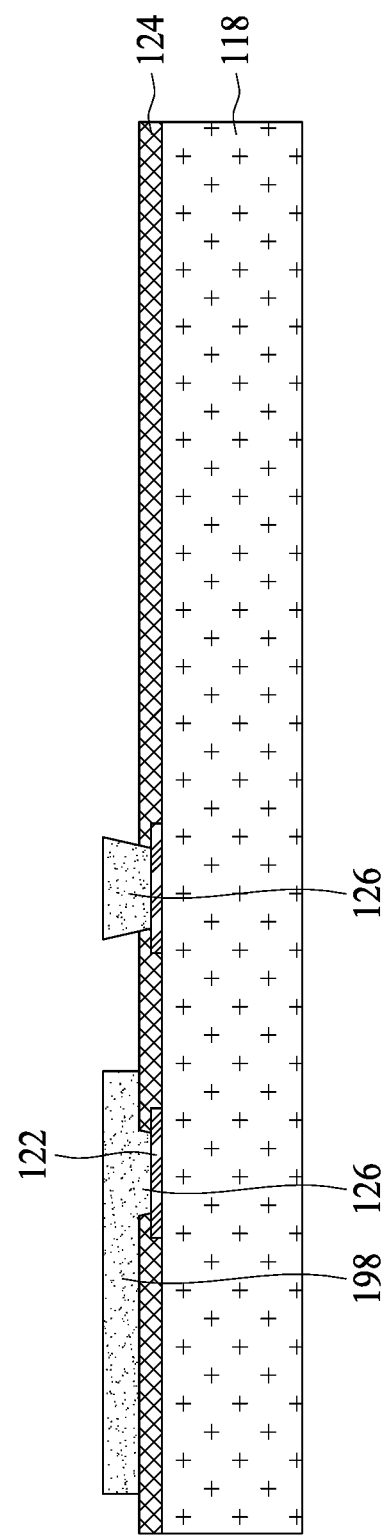
FIGS. 40 through 43, 44A-B, and 45 are views of intermediate steps during a process for forming a package structure in accordance with another embodiment.

FIG. 40 is at a similar point of processing as FIG. 2 described above and the processes and steps performed up until this point are not repeated herein. FIG. 40 includes the semiconductor substrate 118, pads 122, die connectors 126, and passivation film 124. As illustrated, one of the die connectors 126 includes a conductive feature 198 that is formed at the same time as the die connectors 126. The die connectors 126 and conductive feature 198 may be formed of by forming a conductive material in openings of the passivation film 124 and on the exposed portions of the pads 122. The conductive material may be formed by plating, such as electroplating or electroless plating, or the like. The conductive material may comprise a metal, like copper, titanium, tungsten, aluminum, or the like. In some embodiments, the conductive feature 198 is larger (e.g. wider in the cross sectional view of FIG. 40 and/or having a greater top surface area) than the die connectors 126 that do not include a conductive feature 198. The conductive feature 198 forms a redistribution layer 198 to allow for the subsequently formed corresponding through via 136 to be laterally moved and provide more space between adjacent through vias 136, which allows for greater spacings S1 and S2 (see FIG. 44A-B).

Figure 41:
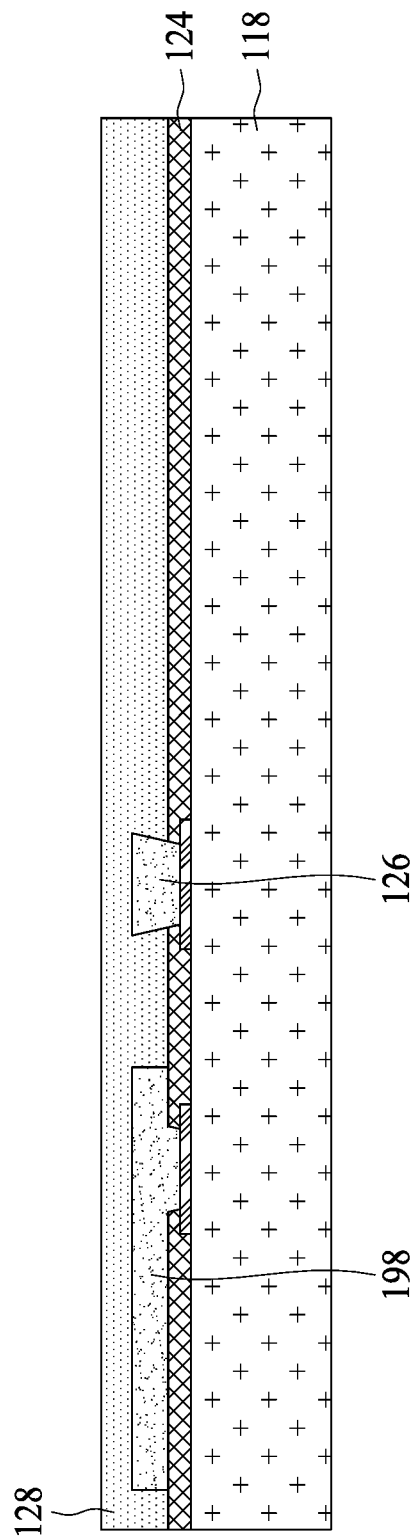

In FIG. 41, the dielectric material 128 is formed on the active sides of the integrated circuit die 114, such as on the passivation films 124, the die connectors 126, and the redistribution layer 198.

Figure 42:
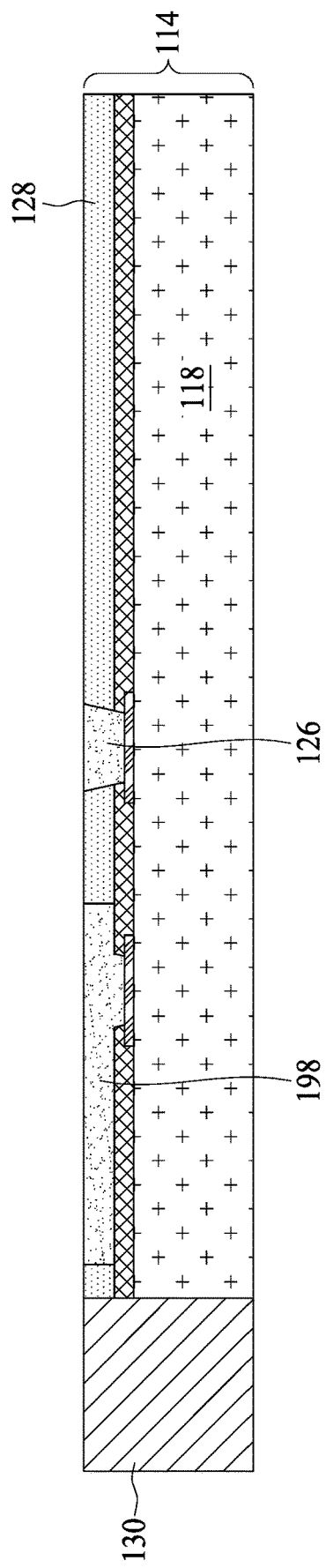

In FIG. 42, after forming the dielectric material 128, the integrated circuit dies 114 may be singulated, such as by sawing or dicing, and adhered to a carrier substrate (not shown, but see carrier substrate 100 in FIG. 2) using, for example, a pick-and-place tool. The encapsulant 130 is formed on the various components. The encapsulant 130 may be a molding compound, epoxy, or the like, and may be applied by compression molding, transfer molding, or the like. After curing, the encapsulant 130 can undergo a grinding process (e.g. a CMP process) to expose die connectors 126 and the redistribution layer 198. Top surfaces of the die connectors 126, the redistribution layer 198, and encapsulant 130 are co-planar after the grinding process. In some embodiments, the grinding may be omitted, for example, if the die connectors 126 and redistribution layer 198 are already exposed.

Figure 43:
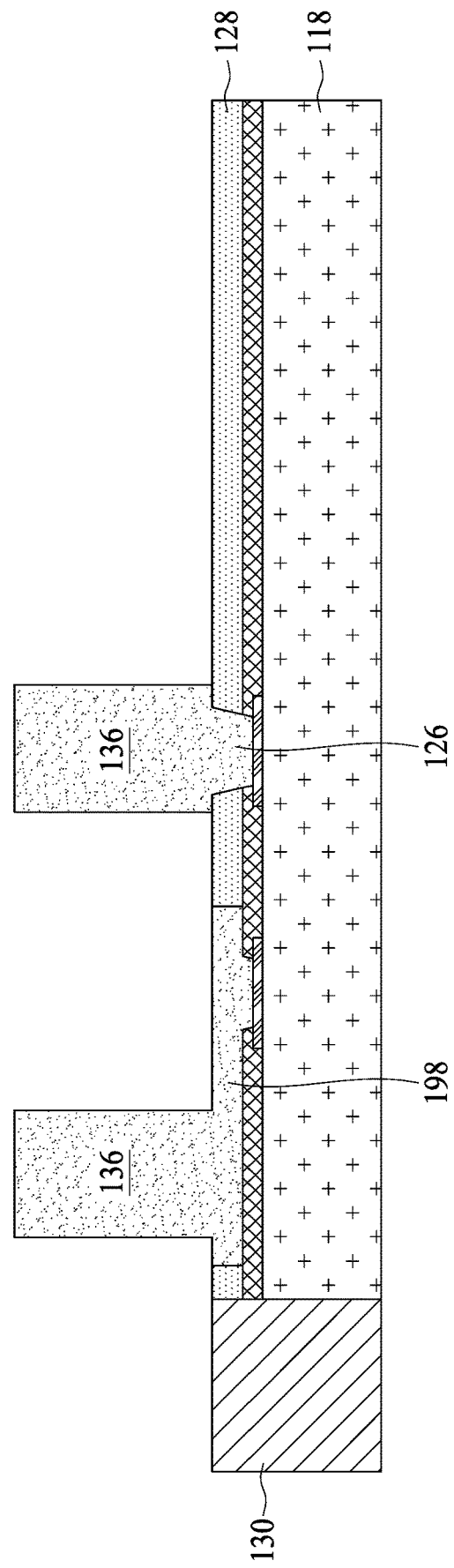

In FIG. 43, the through vias 136 are formed on the die connectors 126 and the redistribution layers 198. The redistribution layer 198 allows for the corresponding through vias 136 to be laterally moved and provide more space between adjacent through vias 136. This greater space between adjacent through vias 136 allows for a greater spacing S1 (see FIG. 44B) between sidewalls of adjacent through vias 136, which also enables a greater spacing S2 between sidewalls of corresponding adjacent metallization patterns 158. Further, in this embodiment, the redistribution layer 198 may be used redistribute some input/output (I/O), such as, for example, a power line and a ground line (see, e.g., FIGS. 46A-C).

As illustrated in FIG. 43, two through vias 136 and one redistribution layer 198 are formed over and coupled to the integrated circuit die 114, and in other embodiments, more or less through vias 136 and/or redistribution layers 198 may be formed over and coupled to the integrated circuit die 114.

Figure 44A:
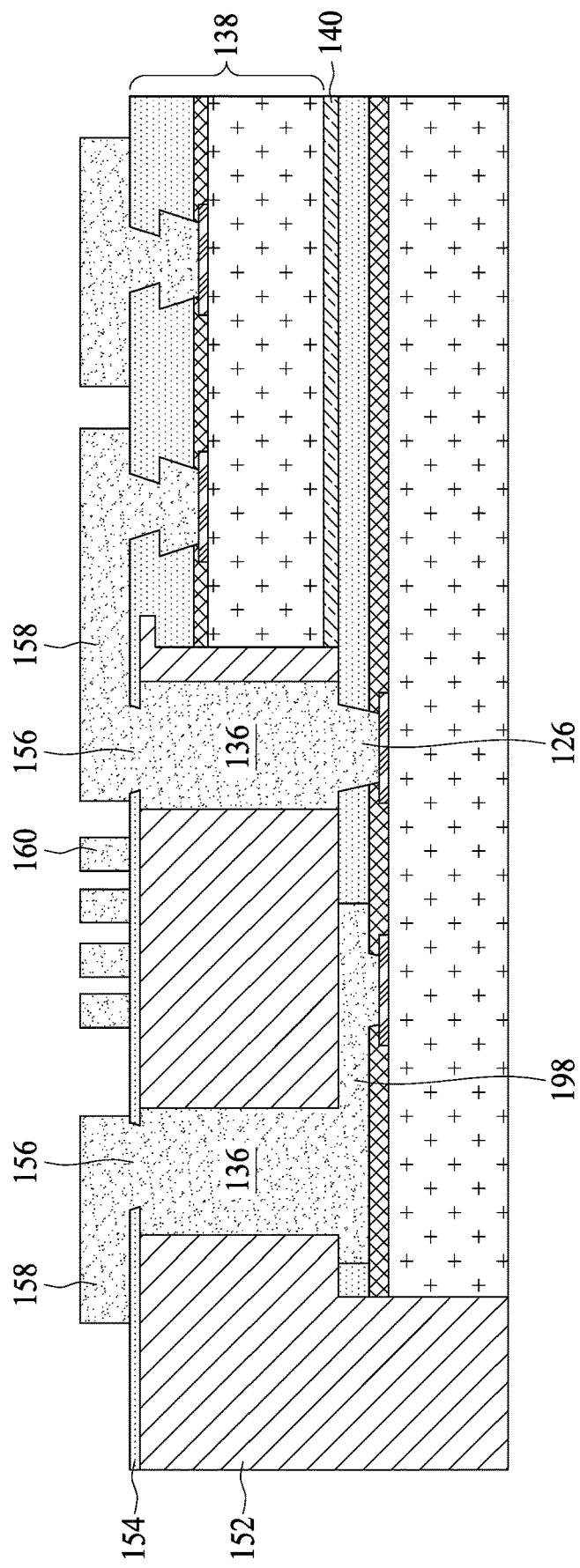
Figure 44B:
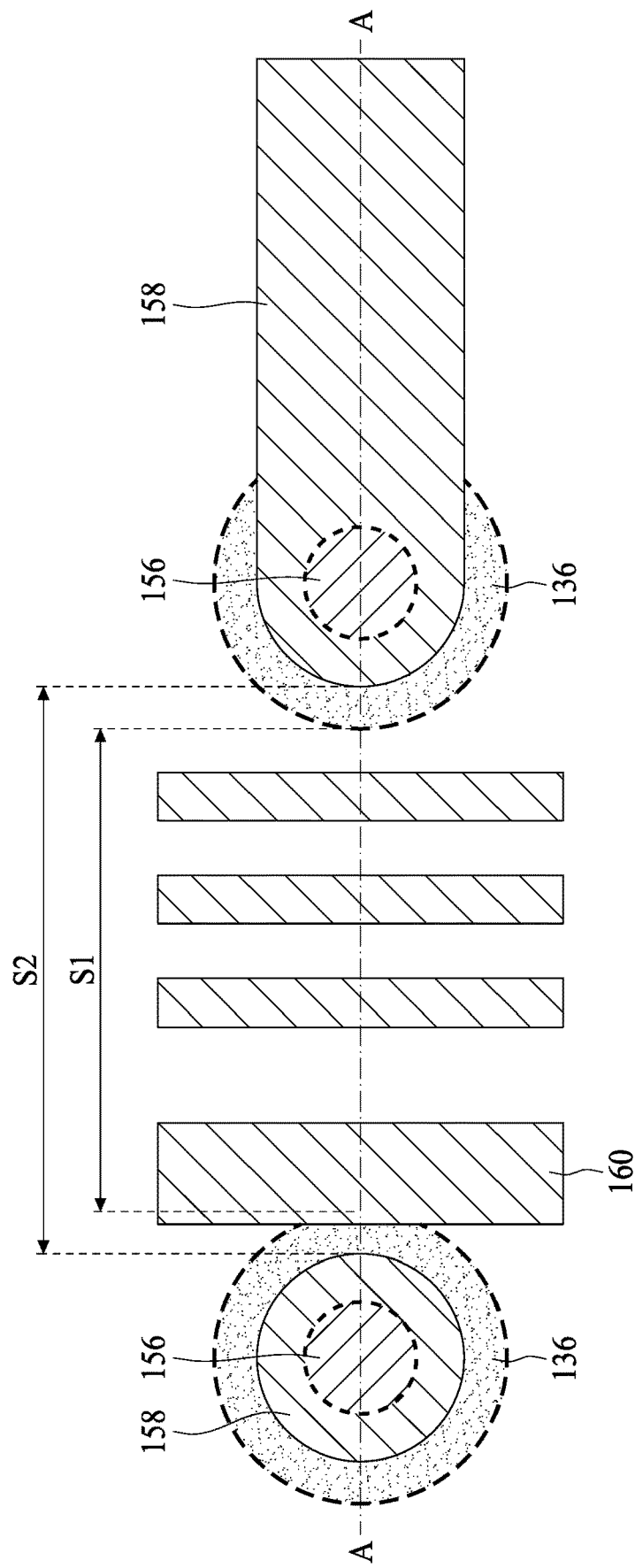

In FIGS. 44A and 44B, the integrated circuit die 138 and encapsulant 152 has been attached and formed as described above in FIGS. 8 and 9 and the descriptions are not repeated herein. Further, the dielectric layer 154, the metallization patterns 158, the vias 156, and the routing lines 160 are formed as described above in reference to FIGS. 10, 11, and 12A-B except that in this embodiment the spacings S1 and S2 may be larger than in FIG. 12A-B due to the redistribution layer 198 laterally moving at least one of the through vias 136. Hence, in this embodiment, there may be more routing lines 160 between the adjacent metallization patterns 158 due to the increased spacings S1 and S2.

Figure 45:
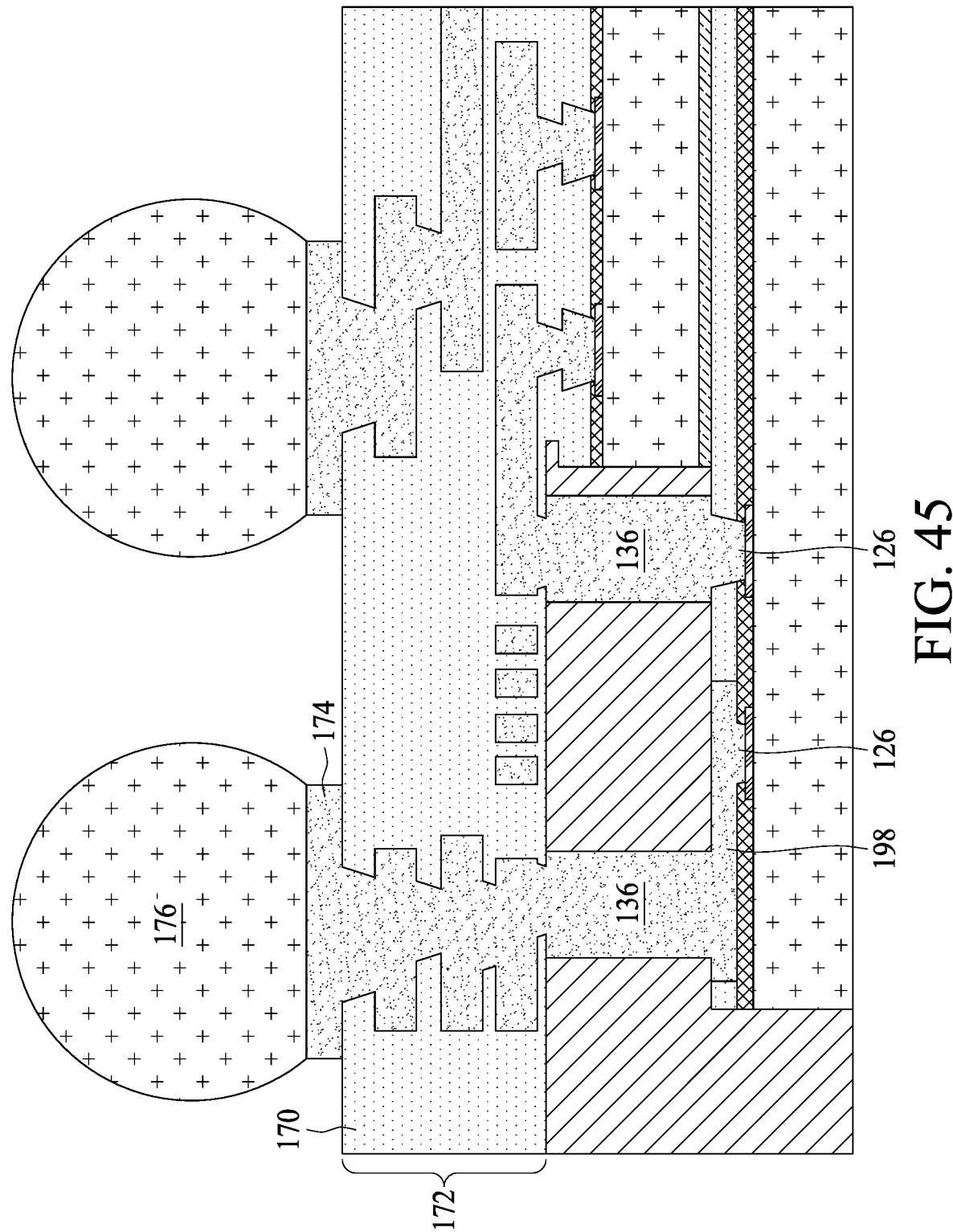

In FIG. 45, the processing continues to form the front side redistribution structure 172, the pads 174, and the connectors 176. The steps and processes to form the front side redistribution structure 172, the pads 174, and the connectors 176 may be similar to the steps and processes described above in FIGS. 13 through 22 and the description is not repeated herein.

Figure 46A:
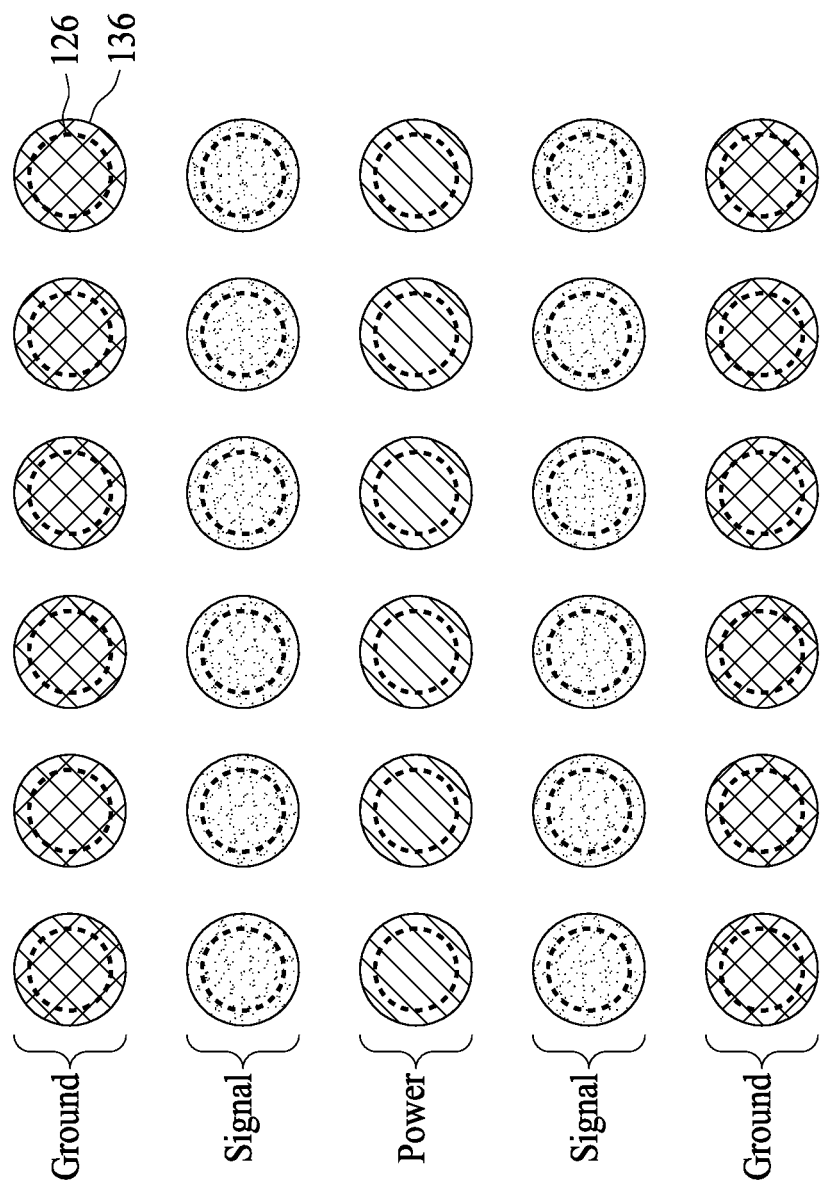
FIGS. 46A-C are top-views of input/output configurations in accordance with some embodiments.
Figure 46B:
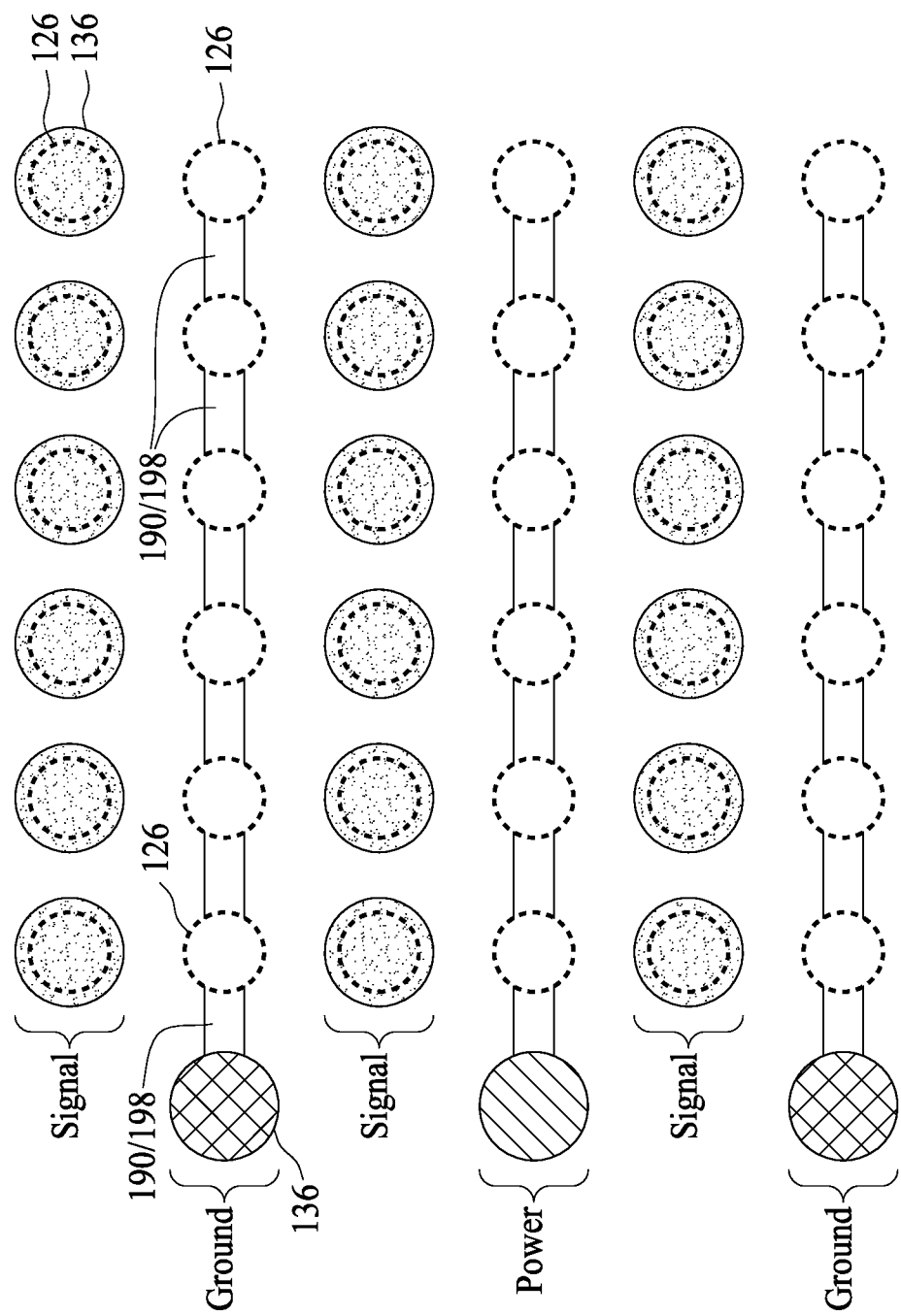
Figure 46C:
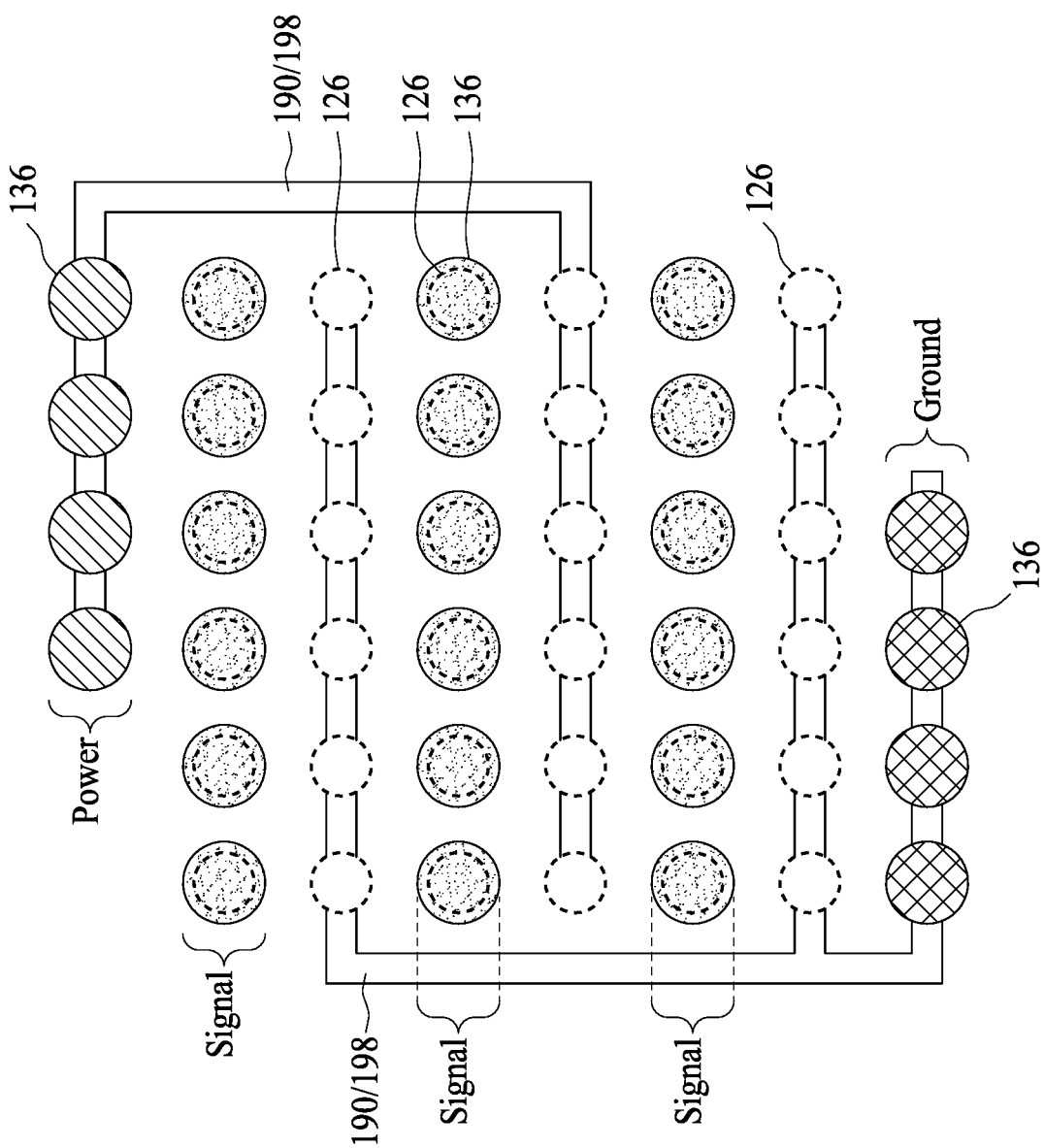

FIGS. 46A, 46B, and 46C are top-views of input/output configurations in accordance with some embodiments. For example, in FIG. 46A, the die connectors 126 are laid out in a grid pattern with corresponding through vias 136 being over and aligned with the die connectors 126. In this example, each die connector 126 in a row is for a specific function (e.g. ground connectors, signal connectors, power connectors, etc.) with the each row of specific function die connectors 126 being separated from another row of the same specific function die connectors 126. For example, as illustrated, the two signal function rows are separated by a power function row.

FIGS. 46B and 46C illustrate examples where at least some of the through vias 136 are coupled to the redistribution layers 190/198. These redistribution layers 190/198 allow for the through vias 136 coupled to them to be moved, and thus, may allow for more routing spacing between the through vias 136 that are not laterally moved. In some embodiments, the redistribution layers 190/198 allow for the power and ground signals to be consolidated to less through vias 136, which can free up more routing space between, for example, the through vias 136 coupled to the signal connectors.

These configurations of the die connectors 126, through vias 136, and redistribution layers 190/198 are only exemplary embodiments, and, other configurations of the die connectors 126, through vias 136, and redistribution layers 190/198 are within the contemplated scope of the present disclosure.

Although the disclosed embodiments include a stacked die structure, the teachings of the embodiments could be applied to a package structure with only one layer of a die in a package. For example, in FIG. 22, the integrated circuit die 114 could be omitted and the through vias 136 could form a back side redistribution structure for a package structure that only had the one layer of dies (e.g. the layer including the integrated circuit die 138.

The embodiments of the present disclosure increase the spacing (e.g., spacing S1) between sidewalls of adjacent through vias 136, which increases the spacing (e.g., spacing S2) between sidewalls of corresponding adjacent metallization patterns 158. By having the greater spacing S2, there is more room for the routing lines 160 to pass between the adjacent metallization patterns 158. This may allow for more and/or wider routing lines 160 to pass between adjacent metallization patterns 158.

In an embodiment, a structure includes: a first integrated circuit die; an encapsulant at least laterally surrounding the first integrated circuit die; a first conductive via extending through the encapsulant; a second conductive via extending through the encapsulant, adjacent sidewalls of the first conductive via and the second conductive via being separated by a first distance; a dielectric layer on the encapsulant, the first conductive via, the second conductive via, and the first integrated circuit die; a third conductive via extending through the dielectric layer to contact the first conductive via; a fourth conductive via extending through the dielectric layer to contact the second conductive via; a first metallization pattern on the dielectric layer and the third conductive via; and a second metallization pattern on the dielectric layer and the fourth conductive via, adjacent sidewalls of the first metallization pattern and the second metallization pattern being separated by a second distance, the second distance being greater than the first distance.

In some embodiments, the structure further includes: a third metallization pattern on the dielectric layer, the third metallization pattern being disposed between the first metallization pattern and the second metallization pattern, the third metallization pattern being spaced apart from the first metallization pattern and the second metallization pattern. In some embodiments of the structure, the first conductive via includes: a first portion having a first width, the first width being measured in a first direction, the first direction being parallel to a major surface of the first integrated circuit die; and a second portion on the first portion, the second portion having a second width, the second width being measured in the first direction. In some embodiments of the structure, a bottom surface of the first portion of the first conductive via is coplanar with a back side surface of the first integrated circuit die, and a top surface of the second portion of the first conductive via is coplanar with an active surface of the first integrated circuit die. In some embodiments, the structure further includes: a second integrated circuit die, a back side surface of the first integrated circuit die being adhered to an active surface of the second integrated circuit die, the first conductive via and the second conductive via being electrically coupled to the second integrated circuit die. In some embodiments of the structure, the first conductive via is overlying and electrically coupled to the second integrated circuit die. In some embodiments, the structure further includes: a conductive redistribution layer overlying and electrically coupled to the second integrated circuit die, the first conductive via contacting the conductive redistribution layer. In some embodiments of the structure, the second integrated circuit die is electrically coupled to the first integrated circuit die through the first conductive via and the second conductive via. In some embodiments of the structure, at least one sidewall of the first metallization pattern directly overlies the third conductive via, and at least one sidewall of the second metallization pattern directly overlies the fourth conductive via. In some embodiments of the structure, adjacent sidewalls of the third conductive via and the fourth conductive via are separated by a third distance, the third distance being greater than the second distance and the first distance.

In an embodiment, a structure includes: a first integrated circuit die; an encapsulant at least laterally surrounding the first integrated circuit die; a first conductive via extending through the encapsulant; a dielectric layer on the first conductive via, the encapsulant, and the first integrated circuit die; a second conductive via extending through the dielectric layer to contact the first conductive via; and a metallization pattern on the dielectric layer and the second conductive via, at least one sidewall of the metallization pattern directly overlying the first conductive via.

In some embodiments of the structure, the second conductive via includes: a first portion having a first width, the first width being measured in a first direction, the first direction being parallel to a major surface of the first integrated circuit die; and a second portion on the first portion, the second portion having a second width, the second width being measured in the first direction. In some embodiments, the structure further includes: a second integrated circuit die, a back side surface of the first integrated circuit die being adhered to an active surface of the second integrated circuit die, the first conductive via being electrically coupled to the second integrated circuit die. In some embodiments of the structure, the second integrated circuit die includes: a conductive feature at the active surface, the first conductive via contacting the conductive feature; and a passivation layer at least laterally surrounding the conductive feature. In some embodiments of the structure, the conductive feature is a third conductive via, the passivation layer surrounding an entirety of the third conductive via. In some embodiments of the structure, the conductive feature is a redistribution line, the passivation layer surrounding an entirety of the redistribution line. In some embodiments of the structure, the conductive feature has a via portion and a line portion, the via portion extending through the passivation layer, the line portion extending along a surface of the passivation layer.

In an embodiment, a structure includes: a first integrated circuit die; a second integrated circuit die on the first integrated circuit die; an encapsulant at least laterally surrounding the second integrated circuit die; a conductive via extending through the encapsulant, the conductive via being electrically coupled to the first integrated circuit die, the conductive via including: a first portion on the first integrated circuit die, the first portion having a first width, the first width being measured in a first direction, the first direction being parallel to a major surface of the first integrated circuit die; and a second portion on the first portion, the second portion having a second width, the second width being measured in the first direction, where top surfaces of the conductive via, the encapsulant, and the second integrated circuit die are level.

In some embodiments, the structure further includes: a redistribution structure on the top surfaces of the conductive via, the encapsulant, and the second integrated circuit die. In some embodiments of the structure, the redistribution structure includes: a dielectric layer on the top surfaces of the conductive via, the encapsulant, and the second integrated circuit die; and a metallization pattern having a via portion and a line portion, the via portion of the metallization pattern extending through the dielectric layer to contact the conductive via, the line portion of the metallization pattern extending along a surface of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first conductive pillar over and electrically coupled to a first die;
    attaching a second die over the first die;
    encapsulating the first die, the second die, and the first conductive pillar with an encapsulant;
    forming a first redistribution structure over the second die, the first conductive pillar, and the encapsulant, the forming the first redistribution structure comprising:
        forming a dielectric layer over the second die, the first conductive pillar, and the encapsulant;
        forming a first via in the dielectric layer and on the first conductive pillar;
        forming a first metallization pattern on the first via, a sidewall of the first metallization pattern directly overlying the first conductive pillar, the sidewall of the first metallization pattern being laterally outside of the first via; and
        forming a second metallization pattern at a same level as the first metallization pattern, a sidewall of the second metallization pattern directly overlying the first conductive pillar.

2. The method of claim 1, wherein the forming the first conductive pillar further comprises:
    forming a first portion of the first conductive pillar having a first width, the first width being measured in a first direction, the first direction being parallel to a major surface of the first die; and
    forming a second portion of the first conductive pillar on the first portion of the first conductive pillar, the second portion having a second width, the second width being measured in the first direction.

3. The method of claim 1, wherein the first die is electrically coupled to the second die through the first conductive pillar and at least a portion of the first redistribution structure.

4. The method of claim 1 further comprising:
    forming a second conductive pillar over and electrically coupled to a first die, the second conductive pillar extending through the encapsulant, wherein the forming the first redistribution structure further comprises:
forming a second via in the dielectric layer and on the second conductive pillar; and
forming a third metallization pattern on the second via, a sidewall of the third metallization pattern directly overlying the second conductive pillar.

5. The method of claim 4, wherein the second metallization pattern is disposed between the first metallization pattern and the third metallization pattern.

6. The method of claim 5 further comprising:
forming a fourth metallization pattern on the dielectric layer, the fourth metallization pattern being disposed between the first metallization pattern and the third metallization pattern, the fourth metallization pattern being spaced apart from the first metallization pattern, the second metallization pattern, and the third metallization pattern.

7. The method of claim 6, wherein sidewalls of the fourth metallization pattern are laterally spaced apart from the first conductive pillar and the second conductive pillar.

8. The method of claim 1 further comprising:
forming a first redistribution layer over and electrically coupled to the first die, the first conductive pillar being over and electrically coupled to the first redistribution layer.

9. The method of claim 8, wherein the first die comprises a first die connector, the first conductive pillar being laterally spaced apart from the first die connector, the first redistribution layer connecting the first die connector and the first conductive pillar.

10. A method comprising:
forming a first conductive pillar and a second conductive pillar over and electrically coupled to a first die;
attaching a second die to the first die, the second die having die connectors on a front side, the front side of the second die facing away from the first die;
encapsulating the first die, the second die, the first conductive pillar, and the second conductive pillar with a first encapsulant, the first encapsulant covering a sidewall of the first die;
forming a first redistribution structure over the first die, the second die, the first conductive pillar, the second conductive pillar, and the first encapsulant, wherein forming the first redistribution structure comprises:
forming a first via on the first conductive pillar;
forming a second via on the second conductive pillar;
forming a first metallization pattern on the first via, a first sidewall of the first metallization pattern directly overlying the first conductive pillar; and
forming a second metallization pattern on the second via, a second sidewall of the second metallization pattern directly overlying the second conductive pillar.

11. The method of claim 10, wherein forming the first conductive pillar further comprises:
forming a first portion of the first conductive pillar having a first width, the first width being measured in a first plane, the first plane being parallel to a major surface of the first die; and
forming a second portion of the first conductive pillar on the first portion of the first conductive pillar, the second portion having a second width, the second width being measured in the first plane.

12. The method of claim 11, wherein a bottom surface of the first portion of the first conductive pillar is coplanar with a back side surface of the second die, and wherein a top surface of the second portion of the first conductive pillar is coplanar with an active surface of the second die.

13. The method of claim 10, wherein inner sidewalls of the first conductive pillar and the second conductive pillar are separated by a first distance, wherein the first sidewall of the first metallization pattern and the second sidewall of the second metallization pattern are separated by a second distance, the second distance being greater than the first distance.

14. The method of claim 10, wherein the first die is electrically coupled to the second die through the first conductive pillar and at least a portion of the first redistribution structure.

15. A method comprising:
forming a first conductive pillar and a second conductive pillar over and electrically coupled to a first die;
attaching a second die to the first die;
encapsulating the first die, the second die, the first conductive pillar, and the second conductive pillar with a first encapsulant;
forming a first via on the first conductive pillar;
forming a second via on the second conductive pillar;
forming a first metallization pattern on the first via, wherein the first die is electrically coupled to the second die through the first conductive pillar and the first metallization pattern;
forming a second metallization pattern on the second via; and
forming a third metallization pattern over the first encapsulant and between the first and second metallization patterns, the third metallization pattern being at a same level as the first metallization pattern and the second metallization pattern.

16. The method of claim 15 further comprising:
forming a fourth metallization pattern over the first encapsulant, the fourth metallization pattern being disposed between the first metallization pattern and the second metallization pattern, the fourth metallization pattern being spaced apart from the first metallization pattern, the second metallization pattern, and the third metallization pattern.

17. The method of claim 15 further comprising:
forming a first redistribution layer over and electrically coupled to the first die, the second conductive pillar being over and electrically coupled to the first redistribution layer.

18. The method of claim 17, wherein the first die comprises a first die connector, the first conductive pillar being laterally spaced apart from the first die connector, the first redistribution layer connecting the first die connector and the first conductive pillar.

19. The method of claim 15, wherein forming the first conductive pillar further comprises:
forming a first portion of the first conductive pillar having a first width; and
forming a second portion of the first conductive pillar on the first portion of the first conductive pillar, the second portion having a second width.

20. The method of claim 15, wherein inner sidewalls of the first conductive pillar and the second conductive pillar are separated by a first distance, wherein a first sidewall of the first metallization pattern and a second sidewall of the second metallization pattern are separated by a second distance, the second distance being greater than the first distance.

* * * * *